US010777684B2

(12) United States Patent
Liu

(10) Patent No.: US 10,777,684 B2
(45) Date of Patent: Sep. 15, 2020

(54) METHOD OF MAKING A VERTICAL PILLAR DEVICE AND STRUCTURE THEREOF

(71) Applicant: Avago Technologies International Sales Pte. Limited, Singapore (SG)

(72) Inventor: Qing Liu, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 0 days.

(21) Appl. No.: 16/057,612

(22) Filed: Aug. 7, 2018

(65) Prior Publication Data

US 2020/0052128 A1 Feb. 13, 2020

(51) Int. Cl.
| | |
|---|---|
| H01L 29/786 | (2006.01) |
| H01L 29/423 | (2006.01) |
| H01L 29/66 | (2006.01) |
| H01L 29/16 | (2006.01) |
| H01L 29/20 | (2006.01) |
| H01L 29/78 | (2006.01) |

(52) U.S. Cl.
CPC ........ *H01L 29/78642* (2013.01); *H01L 29/16* (2013.01); *H01L 29/20* (2013.01); *H01L 29/42392* (2013.01); *H01L 29/66666* (2013.01); *H01L 29/7827* (2013.01)

(58) Field of Classification Search
CPC ............. H01L 29/7813; H01L 29/7802; H01L 21/823885; H01L 21/823821; H01L 29/78696; H01L 29/7827
USPC ........ 257/328, 329, 351, 365; 438/212, 268, 438/176
See application file for complete search history.

(56) References Cited

U.S. PATENT DOCUMENTS

| | | | | |
|---|---|---|---|---|
| 6,556,231 | B2 * | 5/2003 | Ogawa et al. .... | H01L 21/02381 438/448 |
| 9,443,982 | B1 * | 9/2016 | Balakrisnan et al. | ....................... H01L 29/78642 |
| 9,647,123 | B1 * | 5/2017 | Balakrisnan et al. | ....................... H01L 29/78618 |

* cited by examiner

*Primary Examiner* — Thinh T Nguyen
(74) *Attorney, Agent, or Firm* — Foley & Lardner LLP

(57) ABSTRACT

A vertical pillar device includes a substrate, one or more pillars, a drain section, and a source section. The one or more pillars include a first end and a second end. The first end is connected to the substrate at a first interface. The substrate and the one or more pillars are made of different materials. The drain section surrounds the one or more pillars near the first end and away from the first interface. The source section connects to the one or more pillars at the second end.

20 Claims, 46 Drawing Sheets

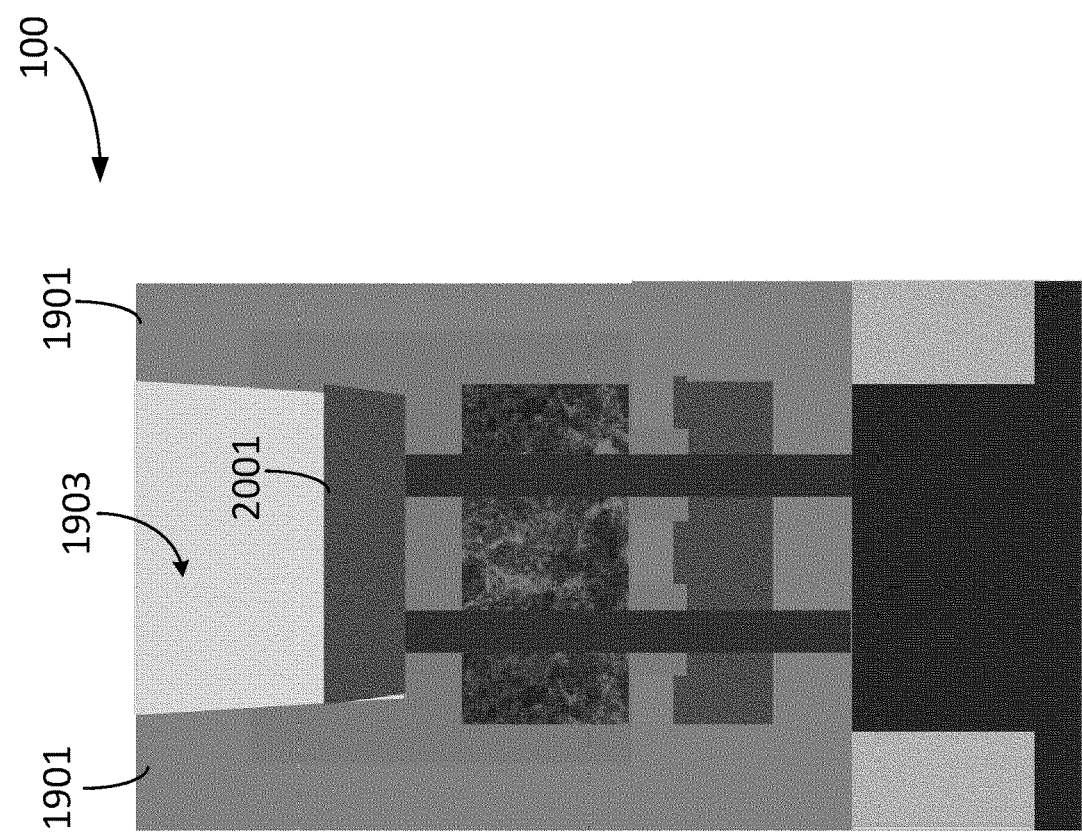

METHOD OF MAKING A VERTICAL PILLAR DEVICE AND STRUCTURE THEREOF

FIELD OF THE DISCLOSURE

This disclosure generally relates to method of fabricating a vertical pillar device and structure thereof including but not limited to vertical transistors and a method of fabricating a vertical pillar device for the vertical transistors.

BACKGROUND OF THE DISCLOSURE

Complementary metal oxide (CMOS) technology is used to fabricate integrated circuits such as microprocessors, microcontrollers, static random access memory (RAM), digital logic circuits and other circuits. As CMOS devices continue scaling to smaller dimensions, various designs and techniques are employed to improve device performance. CMOS devices include vertical transistors that have source/drain regions that are disposed at opposing ends of a vertical channel region. Vertical transistors are attractive candidates for scaling to smaller dimensions.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

FIGS. 20A-20B are cross-sectional view schematic drawings of the vertical pillar structure (partially completed) illustrated in FIG. 1 after source epitaxial formation operation according to some embodiments;

DETAILED DESCRIPTION

Figure 1:
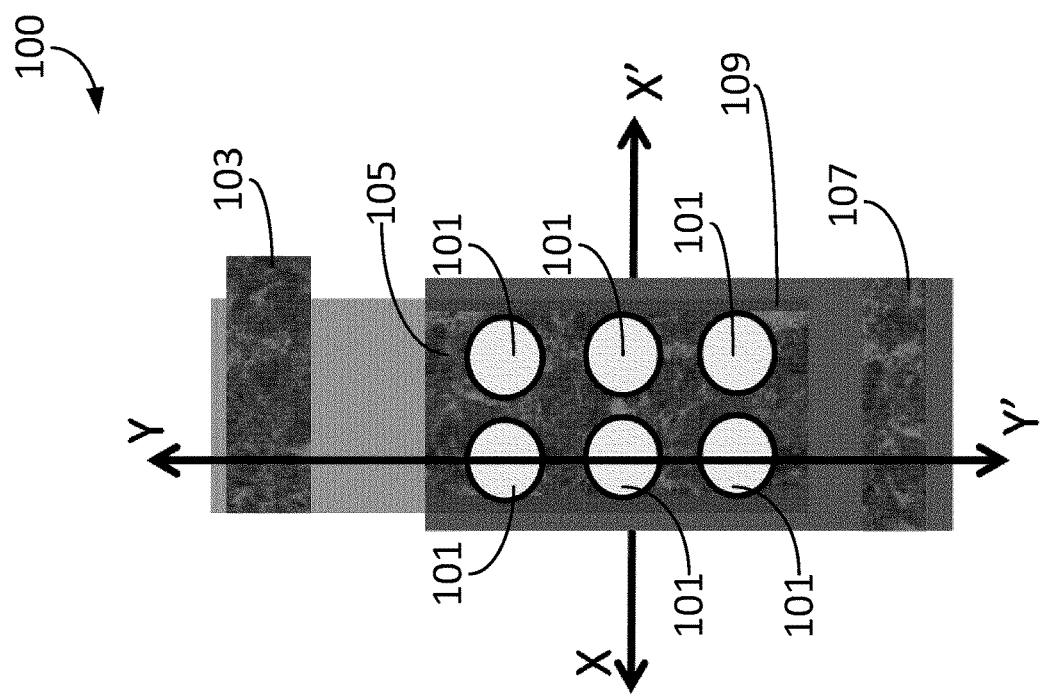
FIG. 1 is a top view schematic drawing of a vertical pillar device according to some embodiments.

Before turning to the features, which illustrate the exemplary embodiments in detail, it should be understood that the application is not limited to the details or methodology set forth in the description or illustrated in the figures. It should also be understood that the terminology is for the purpose of description only and should not be regarded as limiting.

Referring generally to the figures, systems and methods of making a vertical pillar that is used to form vertical transistors containing III-V materials and/or germanium (Ge) (e.g., high Ge percentage (SiGe) silicon germanium material) are shown according to various exemplary embodiments. The present disclosure provides a vertical pillar structure (e.g., a fin) of non-100 percent silicon material (e.g., III-V material or SiGe material) with one or more gates surrounding the vertical pillar structure in some embodiments. The vertical pillar structure maintains high density and better electrostatic characteristics due to signal gate surrounding multiple pillars of non-100 percent silicon material in some embodiments. In some embodiments, a replacement technique is used to form fins with materials that are not 100 percent silicon (Si), such as, high Ge percentage SiGe material. The replacement technique forms Si fins, removes the Si fins, and regrows the fins using a different material (e.g., SiGe or III-V) in some embodiments. The replacement technique enables diverse device fabrication on a substrate for a system-on-chip without the need of special substrates (e.g., devices with various types of channel materials) in some embodiments.

In some embodiments, the structure and methods alleviate issues associated with defective epitaxy in the lower portion of the fins due to the lattice mismatch between the fin materials and the substrate (e.g., SI substrate). The defective fin portions associated with defective epitaxy can cause severe device and yield issues such as excessive leakage currents a punch trough. The defective fin portions can also propagate to a top surface of the fin along the fin length direction. In some embodiments, aspect ratio trapping (ART) is used to trap epitaxial defects at the bottom of the trench associated with the replacement technique. In some embodiments, the structure and method is compatible with CMOS processing techniques and is used to fabricate a vertical transistor with a fin channel, a source/drain at or near a top of the fin, a source/drain at or near a bottom of the fin, and a gate at least partially surrounding the fin.

Some embodiments relate to a vertical transistor. The vertical transistor includes a substrate, a pillar, source and a drain. The pillar includes a first end and a second end. The first end is connected to the substrate at a first interface. The substrate and the pillar are made of different materials. The drain surrounds the pillar near the first end and away from the first interface, and the source connects to the pillar at the second end.

Some embodiments relate to a method of fabricating a vertical pillar device. The method includes forming one or more first pillars within a substrate, and replacing the one or more first pillars with one or more second pillars. The one or more second pillars are formed with different material compared to the one or more first pillars, and the one or more second pillars are connected to the substrate at an interface. The method also includes forming a drain section near a bottom of the one or more second pillars and spaced away from the interface.

Some embodiments relate to a method of a method of fabricating a vertical transistor. The method includes forming one or more pillars within a substrate. The one or more pillars are formed with different material compared to the substrate and are connected to the substrate at an interface. The method further includes forming a drain section near a bottom of the one or more pillars and spaced from the interface.

With reference to FIG. 1, a top view of a vertical pillar structure 100 is depicted according to some embodiments. The vertical pillar structure 100 is for the formation of one or more vertical transistors. The vertical pillar structure 100 includes one or more pillars 101, a source contact 105, a drain contact 107, a gate contact 103, and a spacer 109 according to some embodiments. The gate contact 103 is connects between the source contact 105 and the drain contact 107 vertically according to some embodiments. The vertical pillar structure 100 is a portion of an integrated circuit in some embodiments. The source contact 105 completely covers the tops of the pillars 101 in some embodiments. The tops of the pillars 101 are shown in FIG. 1 as exposed for simplicity of description.

The one or more pillars 101 are formed with a desired number of pillars that arranged in desired rows and/or columns according to some embodiments. In some embodiments, the number of the pillars of the vertical pillar structure 100 is determined by the application of the vertical pillar device. For example, if the vertical pillar structure 100 is used for low leakage device such as SRAM, a single pillar 101 is used in the vertical pillar structure 100. For larger leakage parameters and/or current requirements, a single row of pillars and a single column of the pillars 101 are used according to some embodiments. For example, as shown in FIG. 1, the vertical pillar structure 100 includes six pillars 101 arranged in two columns and three rows according to some embodiments. The pillars 101 are formed with any III-V materials or Ge material according to some embodiments.

With reference to FIGS. 2A-23B, cross-sectional views of a partially completed structure of the vertical pillar structure 100 are depicted according to some embodiments. FIGS. 2-23A illustrate cross-sectional views along the XX' direction across the row of pillars 101 as shown in FIG. 1 according to some embodiments. FIGS. 2-23B illustrate cross-sectional views along the YY' direction across the column of pillars 101 as shown in FIG. 1 according to some embodiments.

Figure 2A:
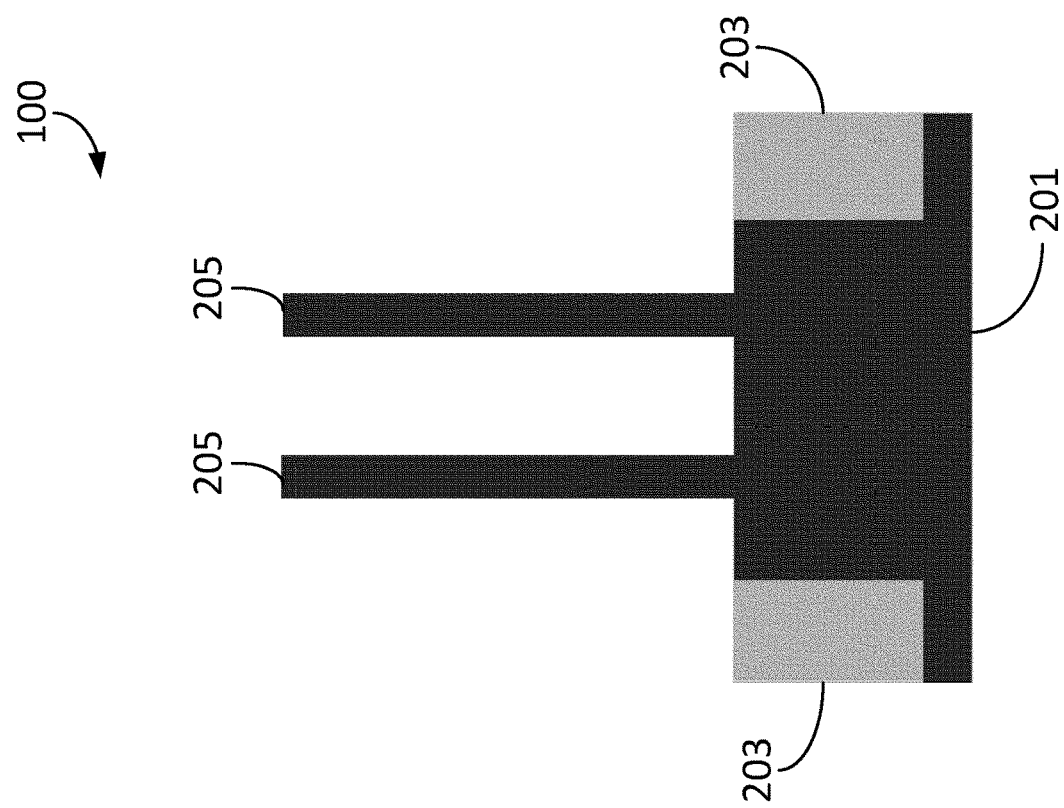
FIGS. 2A-2B are cross-sectional view schematic drawings of the vertical pillar structure (partially completed) illustrated in FIG. 1 after a pillar etch operation according to some embodiments.
Figure 2B:
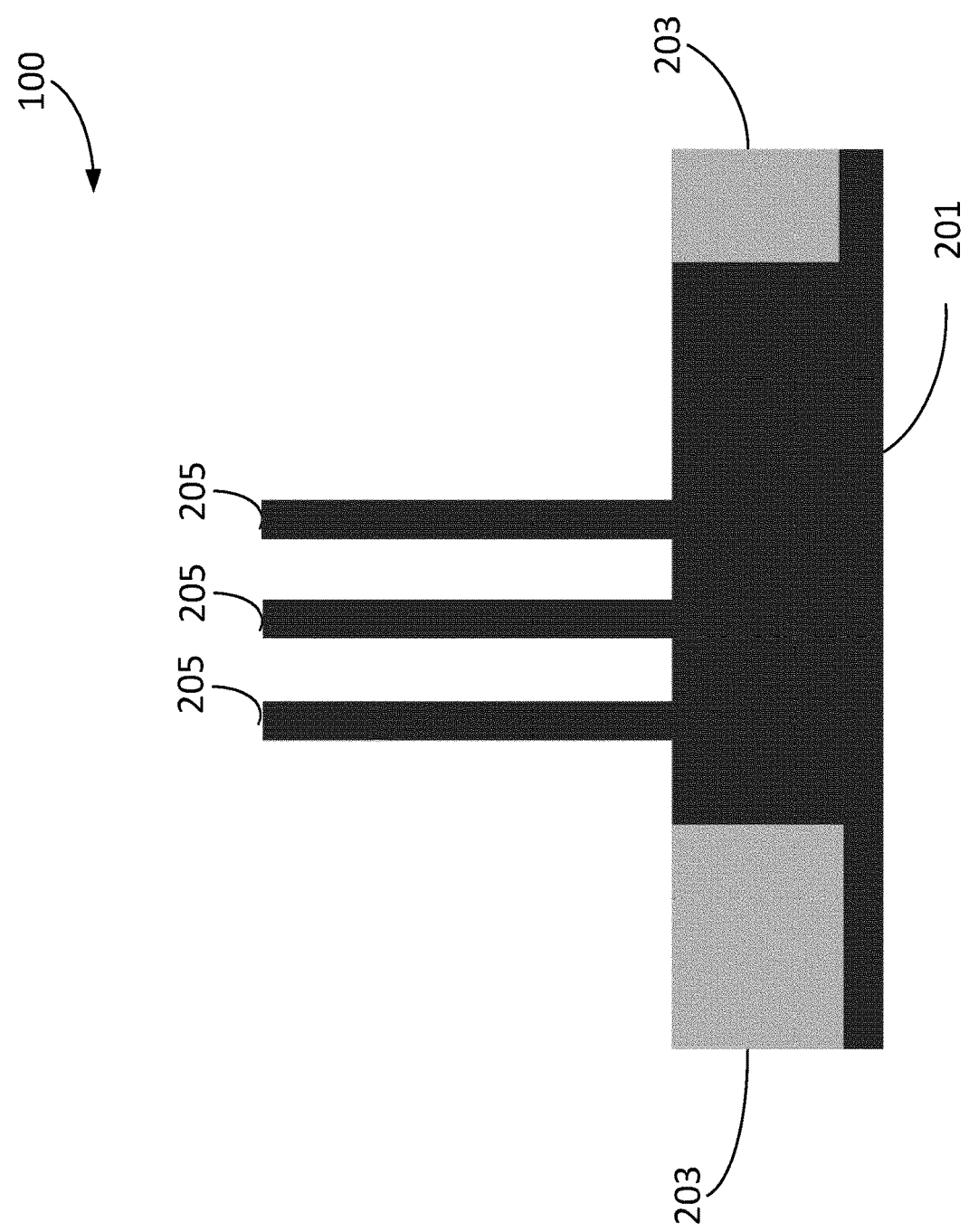

With respect to FIGS. 2A-2B, the vertical pillar structure 100 includes a substrate 201, shallow trench isolation (STI) regions 203, and pillars 205 according to some embodiments. The substrate 201 can include a bulk semiconductor substrate or a semiconductor-on-insulator (SOI) substrate. In some embodiments, the substrate 201 can be formed using any suitable material, such as silicon, silicon germanium, germanium, etc. The STI regions 203 are formed within the substrate 201 according to some embodiments. The STI regions 203 can be formed by any suitable techniques according to some embodiments.

The pillars 205 are formed by etching a portion of the substrate 201 via a lithographic fabrication according to some embodiments. The pillars 205 are generally formed from the same material as the substrate 201 (e.g., silicon pillars) according to some embodiments. The pillars can be formed by a lithographic mask and etch process operation including but not limited to an oxide side wall mask etching operation. The pillars 205 are formed in a desired length by etching according to semiconductor process controls in some embodiments. The pillars 205 are formed within a region of the substrate 201 that is surround by the STI regions 203 according to some embodiments. The pillars 205 can include any desired number of pillars formed and arranged in same or different rows and/or columns according to some embodiments. For example, the pillars 205 can include six pillars arranged in two columns and three rows as shown in FIG. 1 according to some embodiments.

Figure 3A:
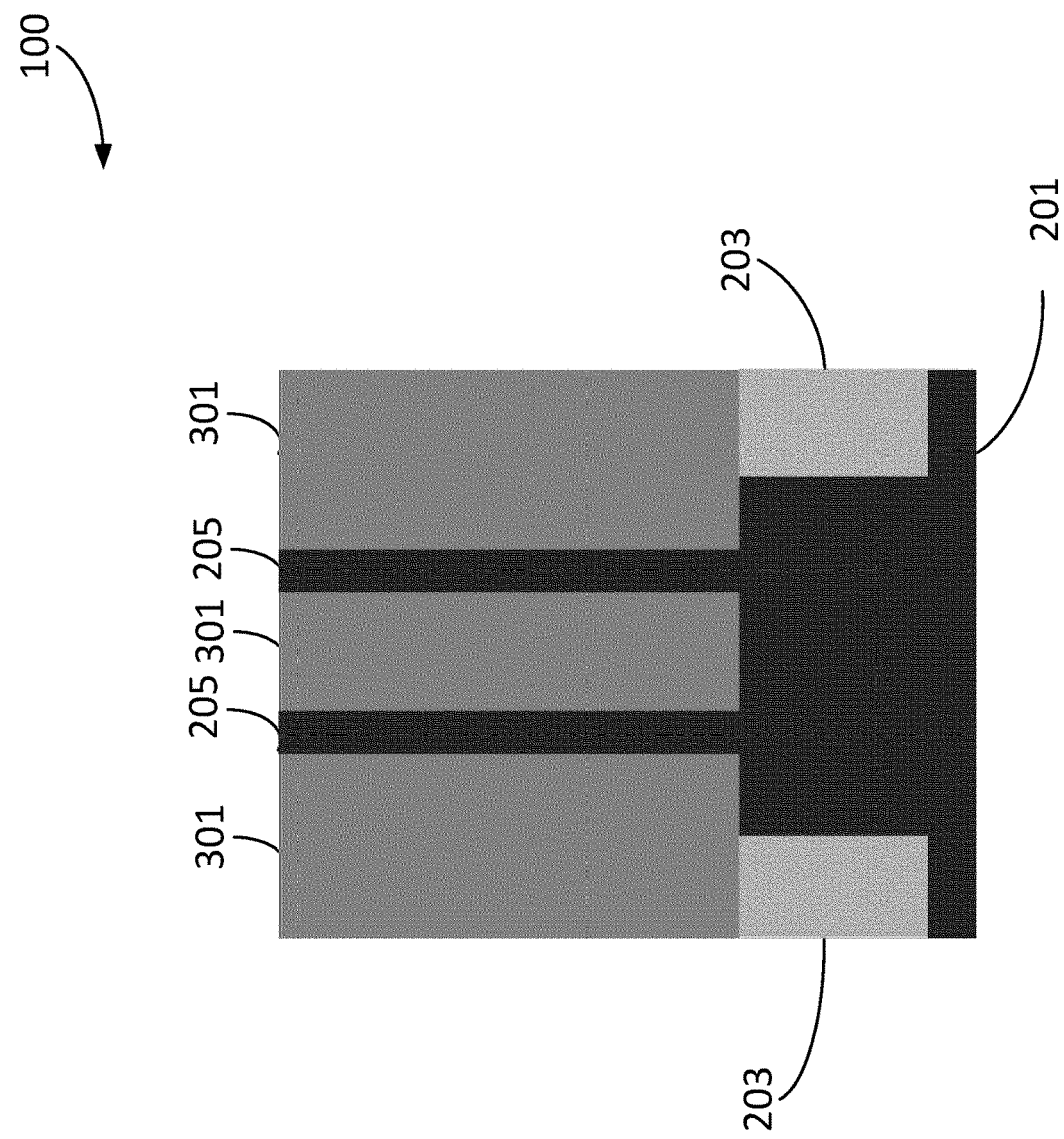
FIGS. 3A-3B are cross-sectional view schematic drawings of the vertical pillar structure (partially completed) illustrated in FIG. 1 after an oxide fill and chemical mechanical polish (CMP) operation according to some embodiments.
Figure 3B:
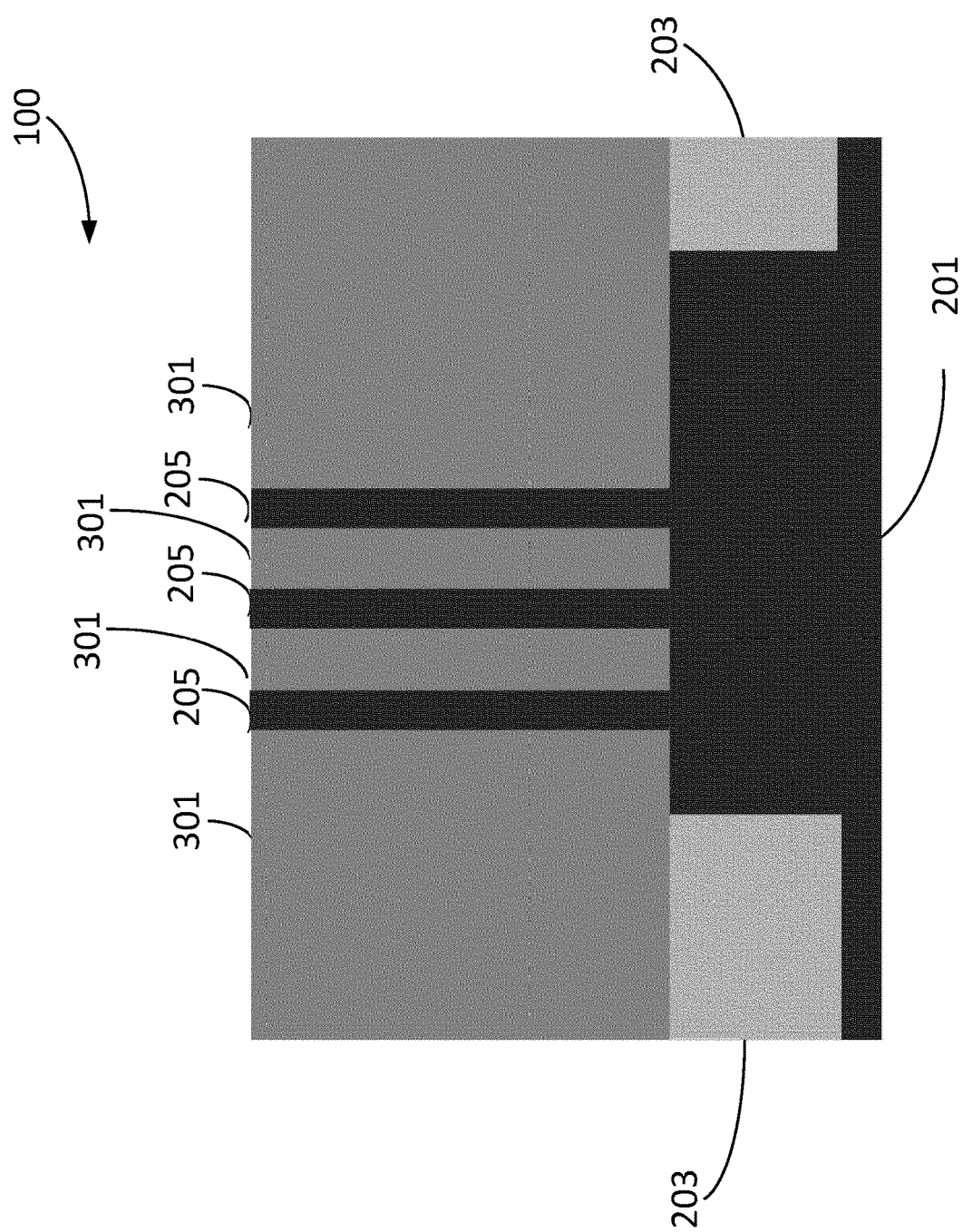

With reference to FIGS. 3A-3B, cross-section views of a partially completed vertical pillar structure 100 are depicted according to some embodiments. After the pillars 205 are formed, an oxide layer 301 is formed by filling or depositing oxide material (e.g., silicon dioxide) above the pillars 205 and the substrate 201 according to some embodiments. The oxide layer 301 is deposited in a tetraethyl orthosilicate (TEOS) operation or other deposition operation. In some embodiments, a polishing process (e.g., a chemical mechanical polishing (CMP) process) is applied on top of the oxide layer 301 to expose the tops of the pillars 205. The oxide 301 is used as a mask layer for further etching process according to some embodiments.

Figure 4A:
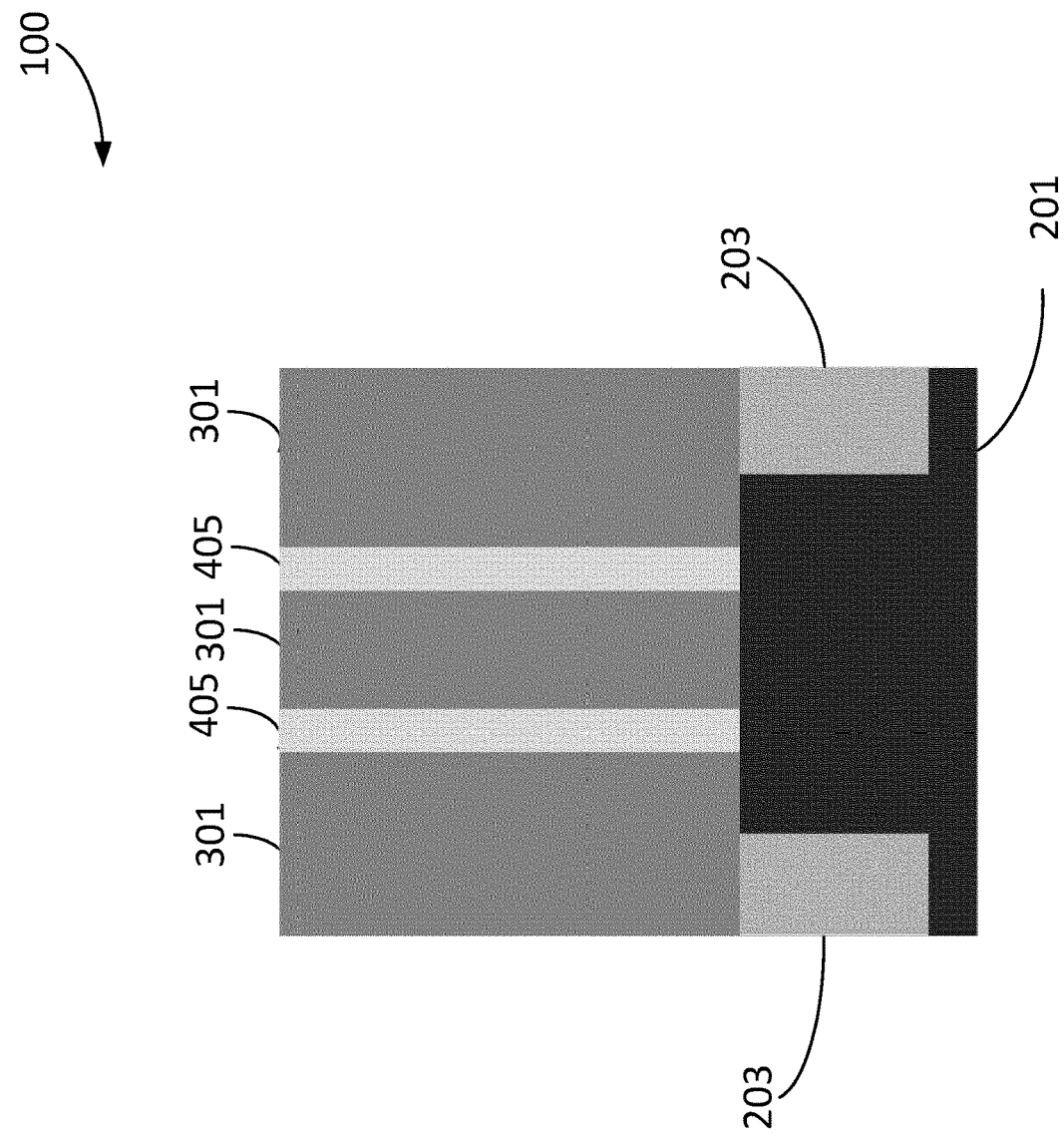
FIGS. 4A-4B are cross-sectional view schematic drawings of the vertical pillar structure (partially completed) illustrated in FIG. 1 after a pillar recess operation according to some embodiments.
Figure 4B:
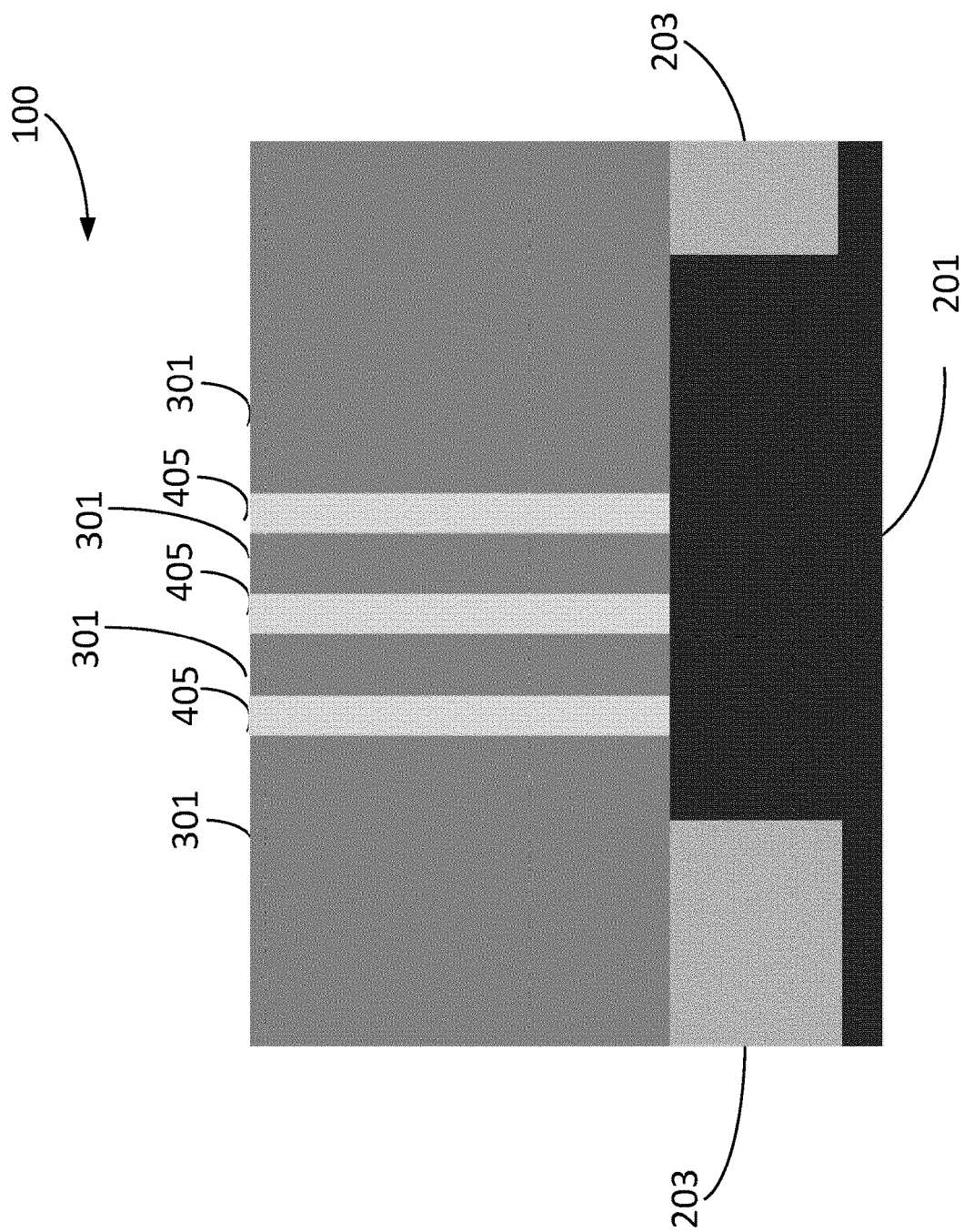

With reference to FIGS. 4A-4B, cross-sectional views of a partially completed vertical pillar structure 100 are depicted according to some embodiments. The vertical pillar structure 100 includes pillar recesses 405 according to some embodiments. The pillar recesses 405 are formed by removing the silicon pillars 205 of FIGS. 3A-3B according to some embodiments. The silicon pillars 205 are removed by etching over the top surface of the vertical pillar structure 100 including the exposed top surface of the silicon pillars 205 and the oxide layer 301 according to some embodiments. The etching operation uses dry etching (reactive ion etching (REI)) selective to silicon with respect to oxide in some embodiments.

Figure 5A:
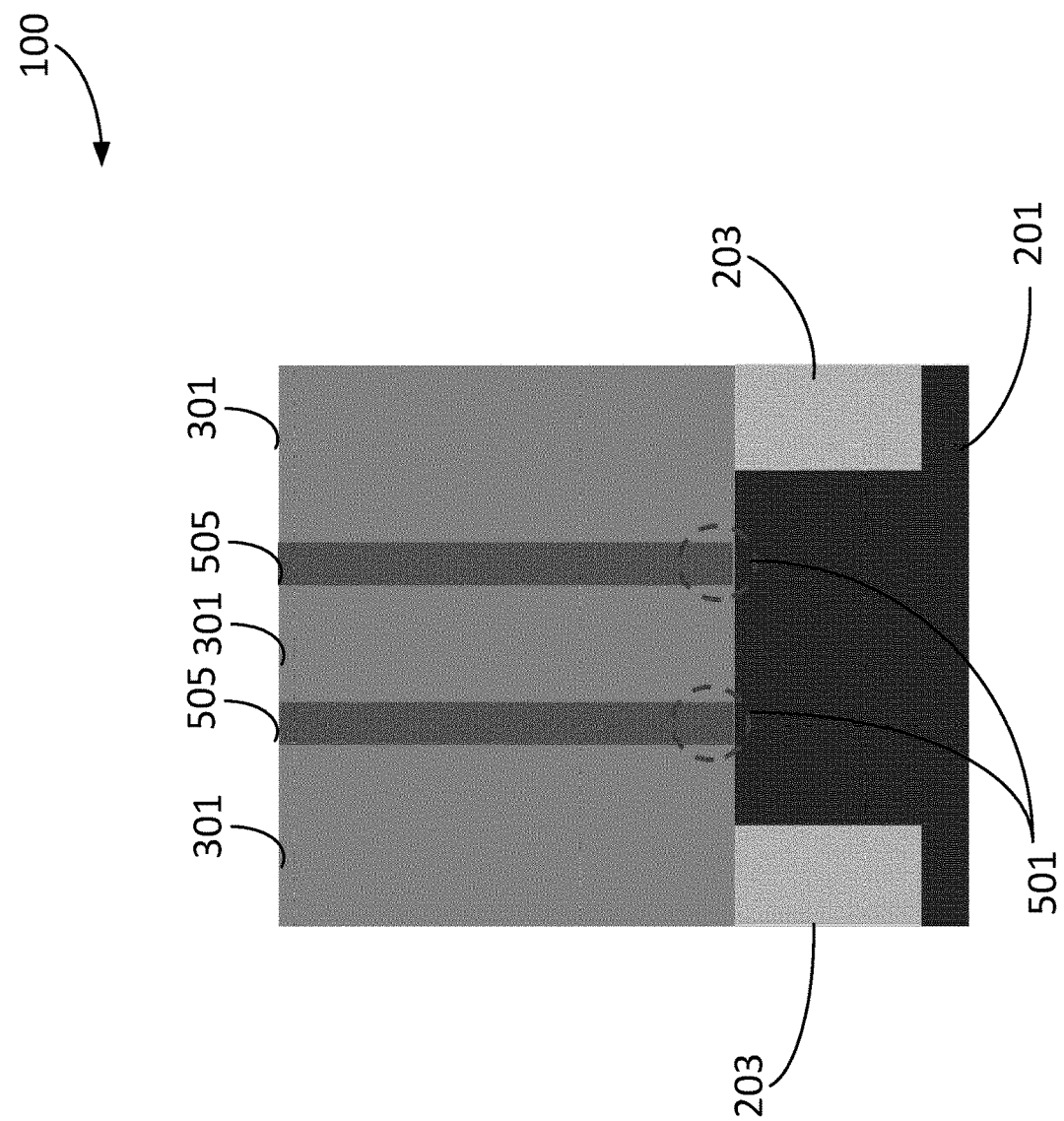
FIGS. 5A-5B are cross-sectional view schematic drawings of the vertical pillar structure (partially completed) illustrated in FIG. 1 after a replacement pillar growth operation according to some embodiments.
Figure 5B:
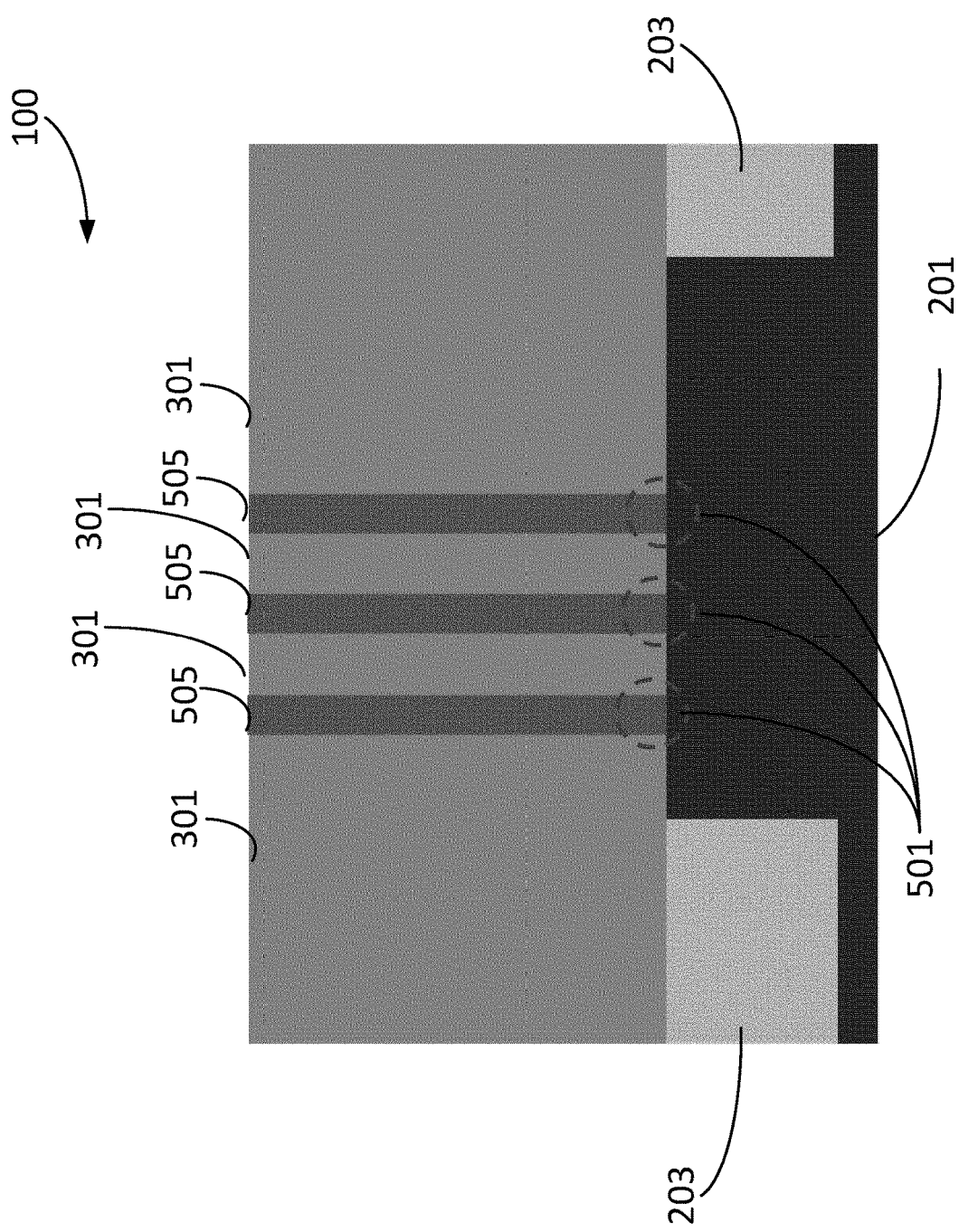

With reference to FIGS. 5A-5B, cross-section views of a partially completed vertical pillar structure 100 are depicted according to some embodiments. The pillars 505 are formed use an epitaxial growth process applied in the pillar recesses 405 according to some embodiments. The pillars 505 are formed in a semiconductor material that is different from the pillars 205 according to some embodiments. In some embodiments, the pillars 505 are formed using any desired semiconductor material (e.g., non-100 percent Si material, such as, any III-V material, Ge, SiGe, etc.). In some embodiments, defects can occur during the epitaxial growth process. In some embodiments, defective regions 501 are formed near the interface between the pillars 505 and the substrate 201.

Figure 6A:
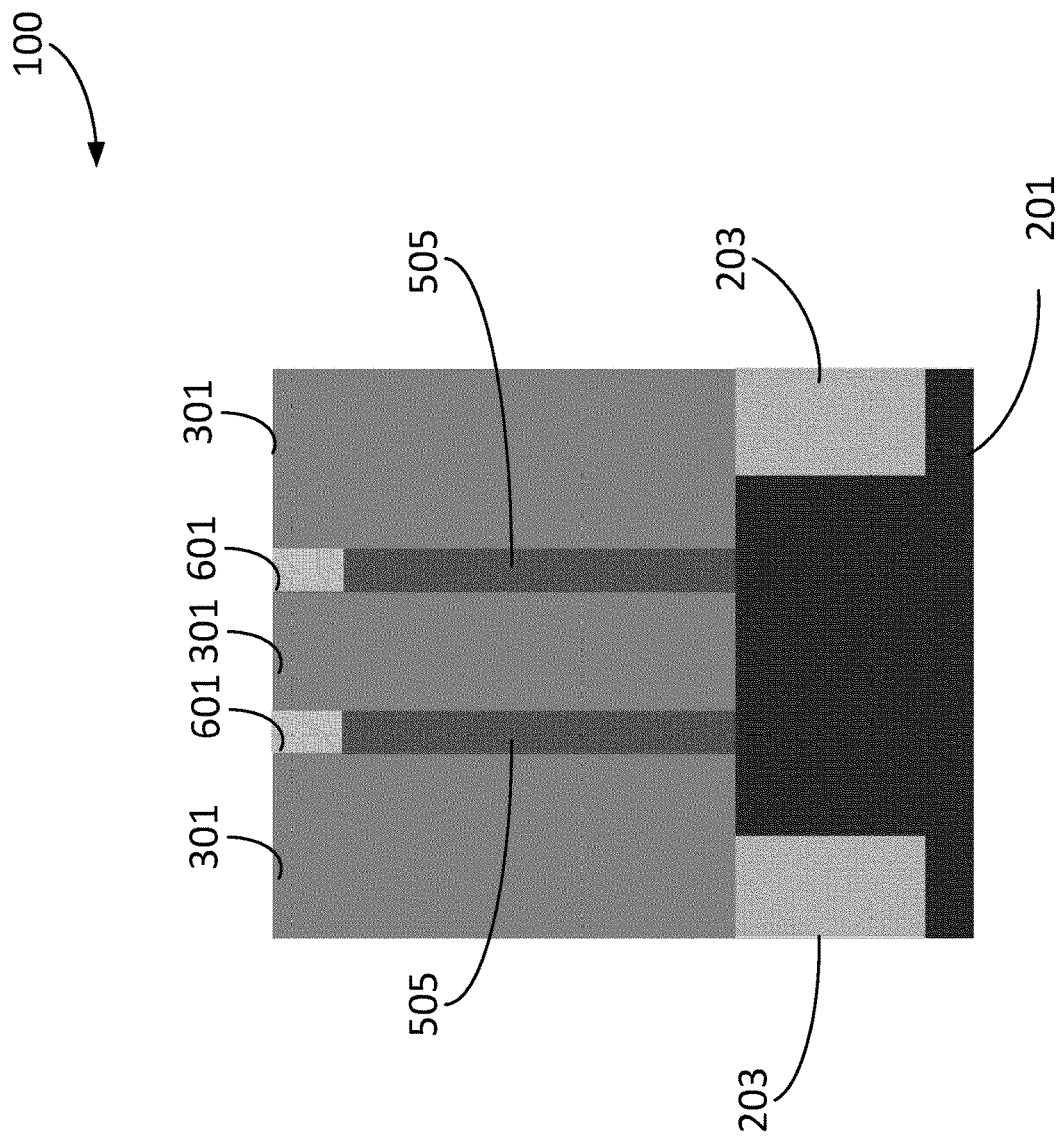
FIGS. 6A-6B are cross-sectional view schematic drawings of the vertical pillar structure (partially completed) illustrated in FIG. 1 after a replacement pillar recess and cap formation operation according to some embodiments.
Figure 6B:
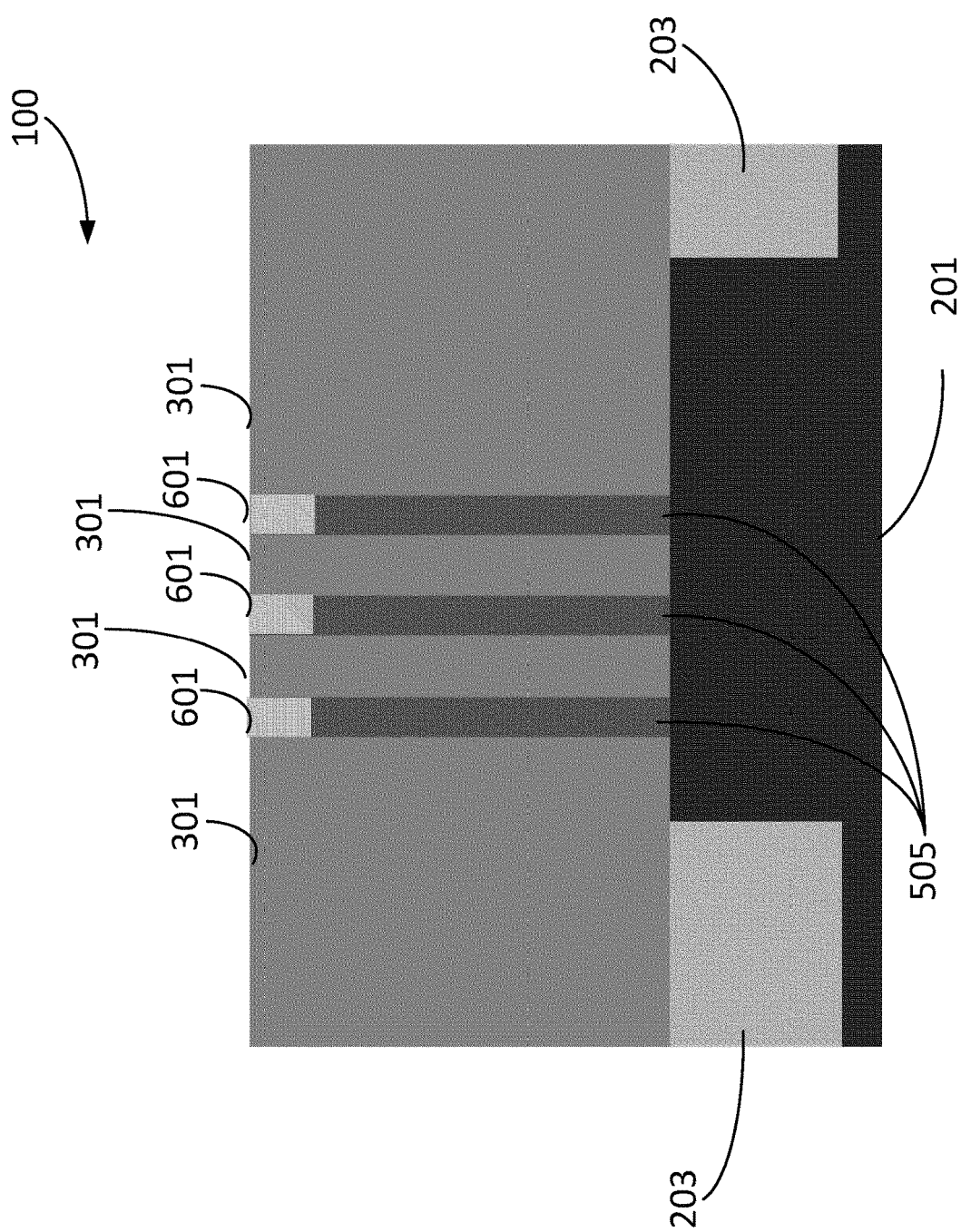

With reference to FIGS. 6A-6B, cross-sectional views of a partially completed vertical pillar structure 100 are depicted according to some embodiments. Caps 601 are formed within the pillar recesses 405 on the top surface of the pillars 505 according to some embodiments. The caps 601 are formed with silicon nitride or any other suitable dielectric material according to some embodiments. The caps 601 can be formed using any suitable techniques, such as performing a rapid thermal chemical vapor deposition of silicon nitride.

Figure 7A:
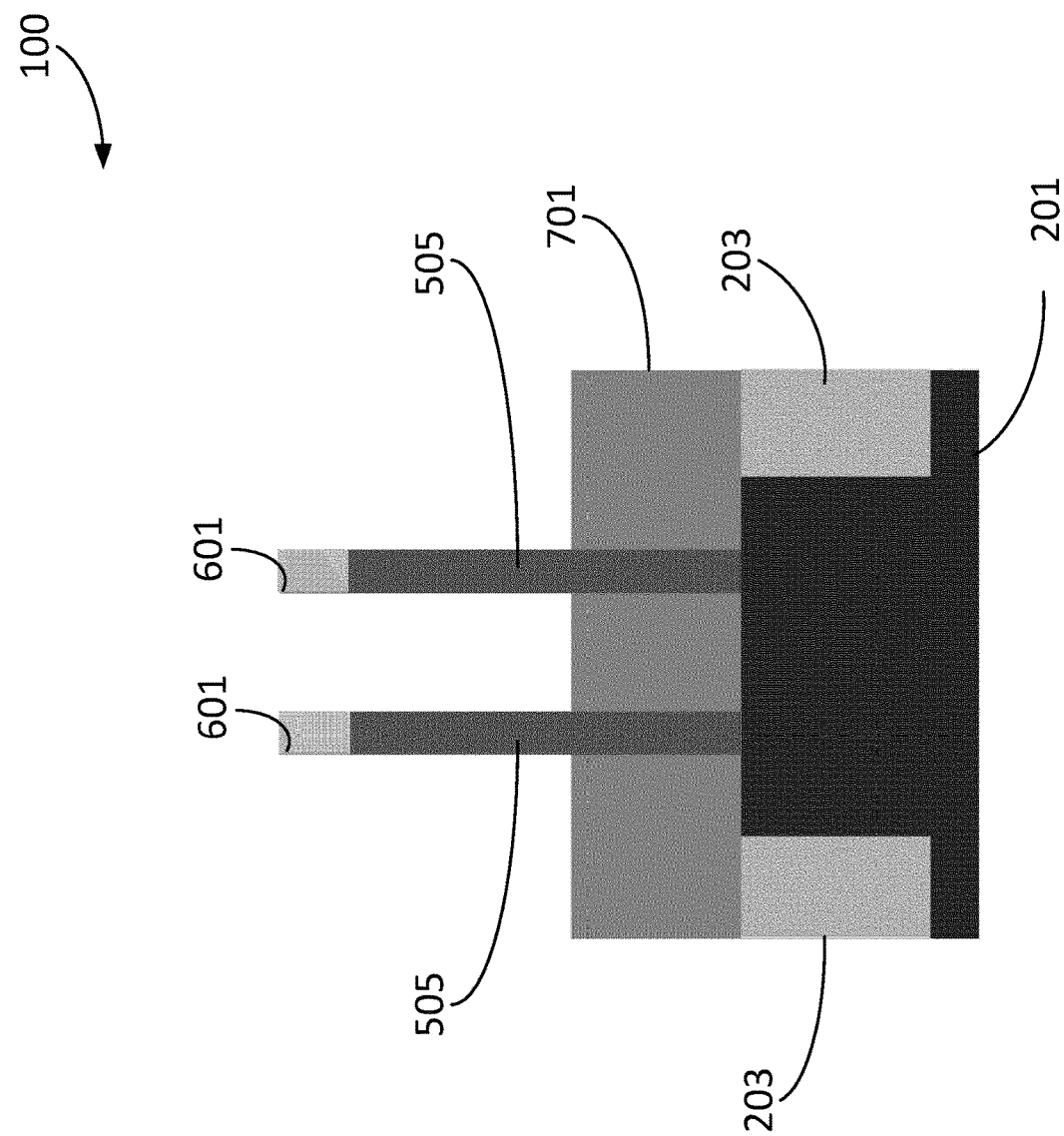
FIGS. 7A-7B are cross-sectional view schematic drawings of the vertical pillar structure (partially completed) illustrated in FIG. 1 after an oxide recess operation according to some embodiments.
Figure 7B:
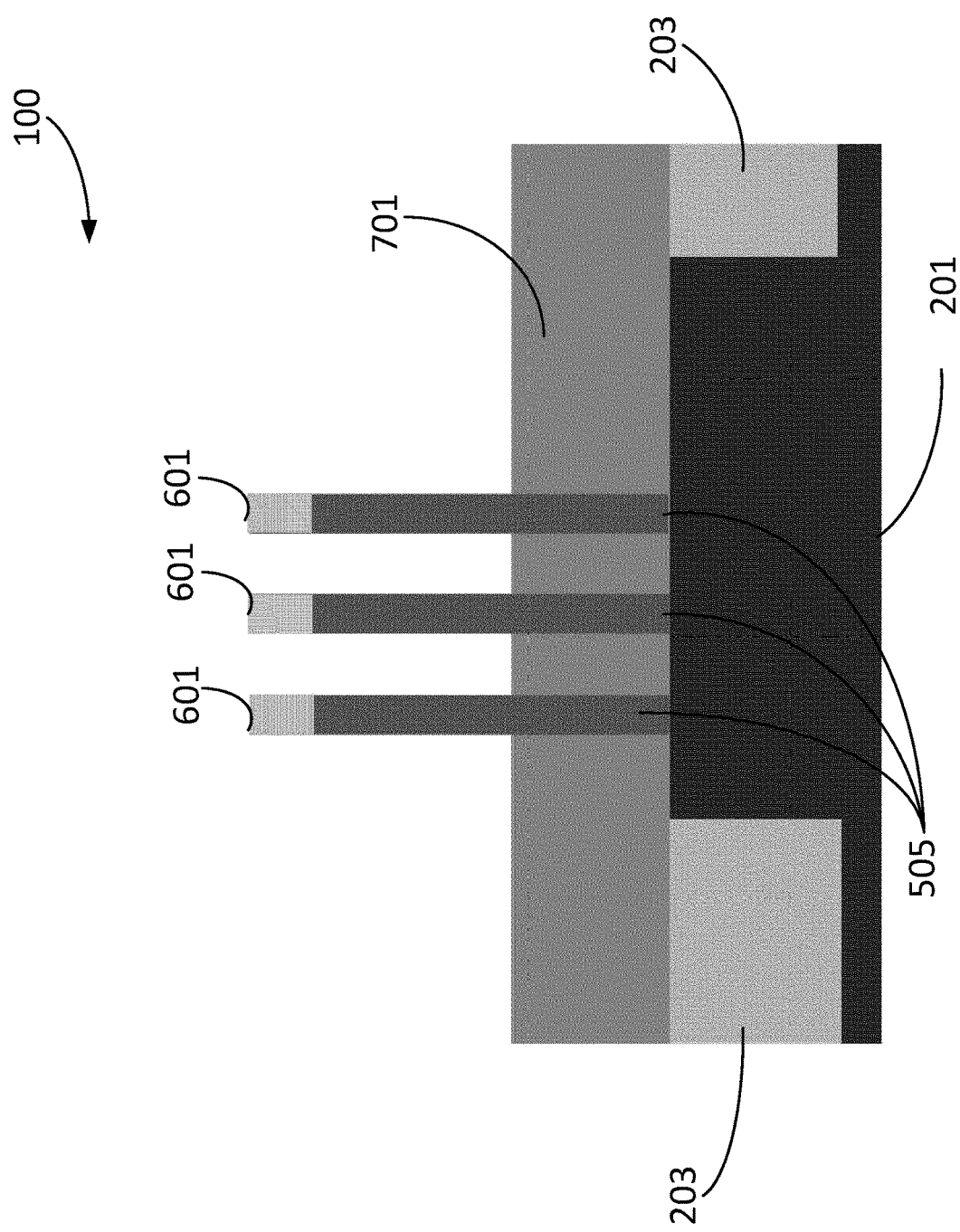

With reference to FIGS. 7A-7B, cross-sectional views of a partially completed vertical pillar structure 100 are depicted according to some embodiments. In some embodiments, an oxide layer 701 is formed by recessing the oxide layer 301 of FIGS. 3A-3B. In some embodiments, the oxide layer 301 is recessed to remove a part of the oxide layer 301 that surrounds the pillars 605 and the caps 601. In some embodiments, the rest of the oxide layer 301 forms the oxide layer 701, so that the caps 601 and a portion of the pillars 605 are exposed. In some embodiments, the depth of removal is controlled through process controls. In some embodiments, the oxide layer 701 is formed by providing a buried hard mask layer at the appropriate depth when the layer for the caps 601 is deposited, the layer for the caps 601 is etched until the hard mask layer is reached, and the hard mask layer is removed to leave the oxide layer 701. In some embodiments, the oxide layer 301 is completely removed and the oxide layer 701 is deposited at an appropriate thickness.

Figure 8A:
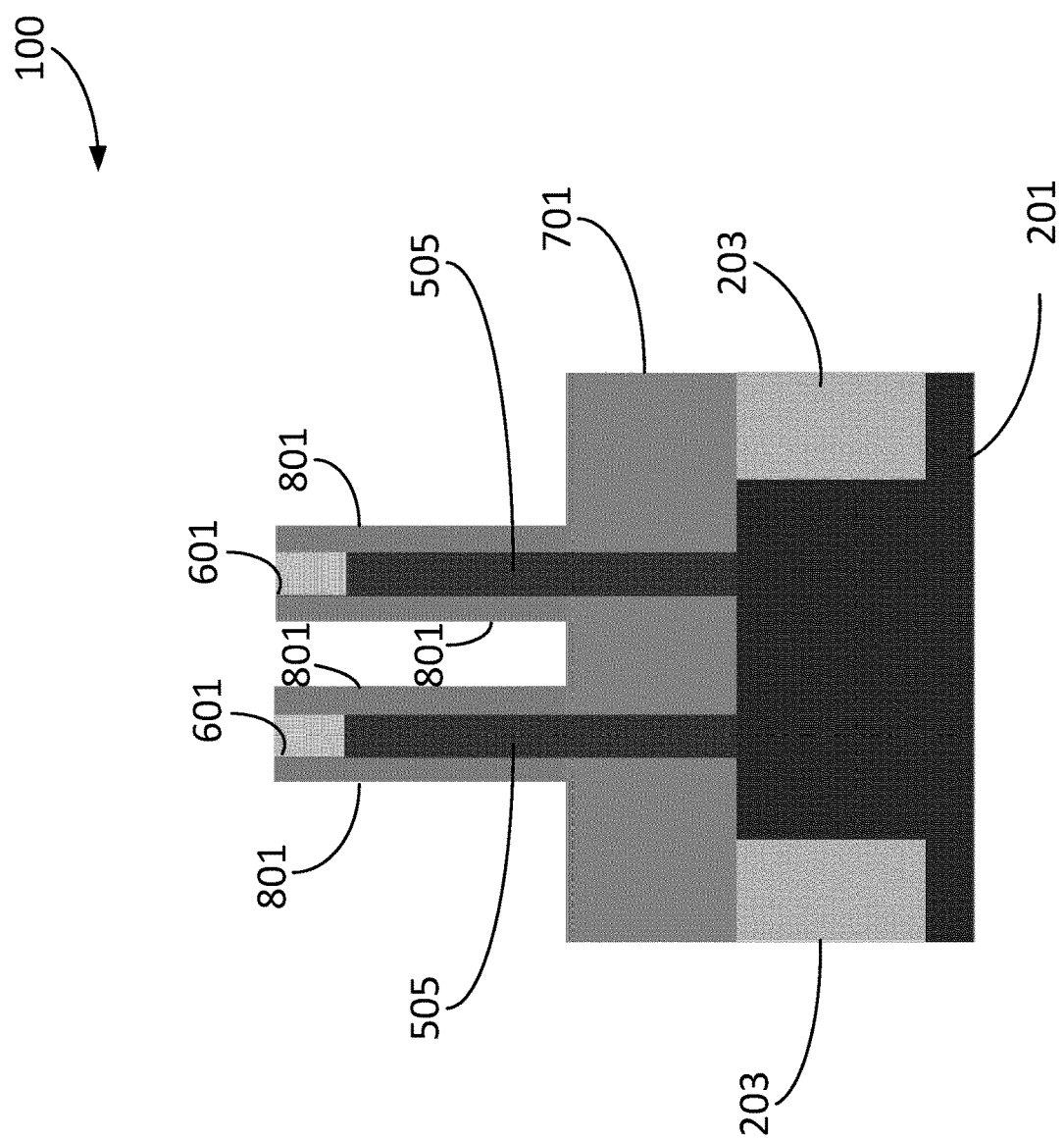
FIGS. 8A-8B are cross-sectional view schematic drawings of the vertical pillar structure (partially completed) illustrated in FIG. 1 after a nitride spacer formation operation according to some embodiments.
Figure 8B:
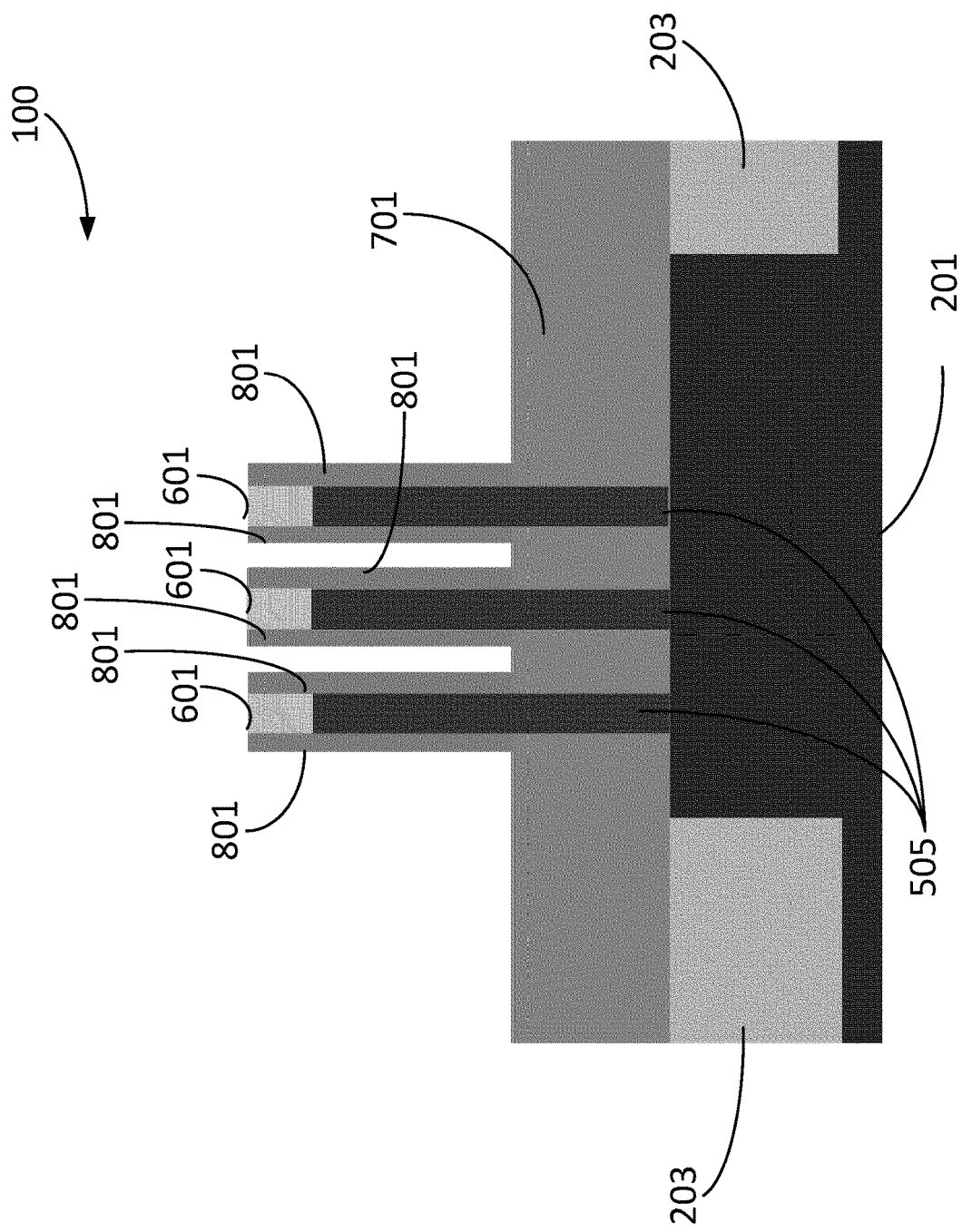

With reference to FIGS. 8A-8B, cross-sectional views of a partially completed vertical pillar structure 100 are depicted according to some embodiments. Spacers 801 are formed surrounding each of the pillars 605 and the caps 601 according to some embodiments. The spacers 801 are formed by conformally depositing a dielectric material, such as silicon nitride, followed by an anisotropic etch process such as reactive ion etch (RIE) selective to silicon nitride material in some embodiments. The dielectric material remains on the surface of the exposed portions of the pillars 605 and the caps 601 as the spacers 801 in some embodiments.

Figure 9A:
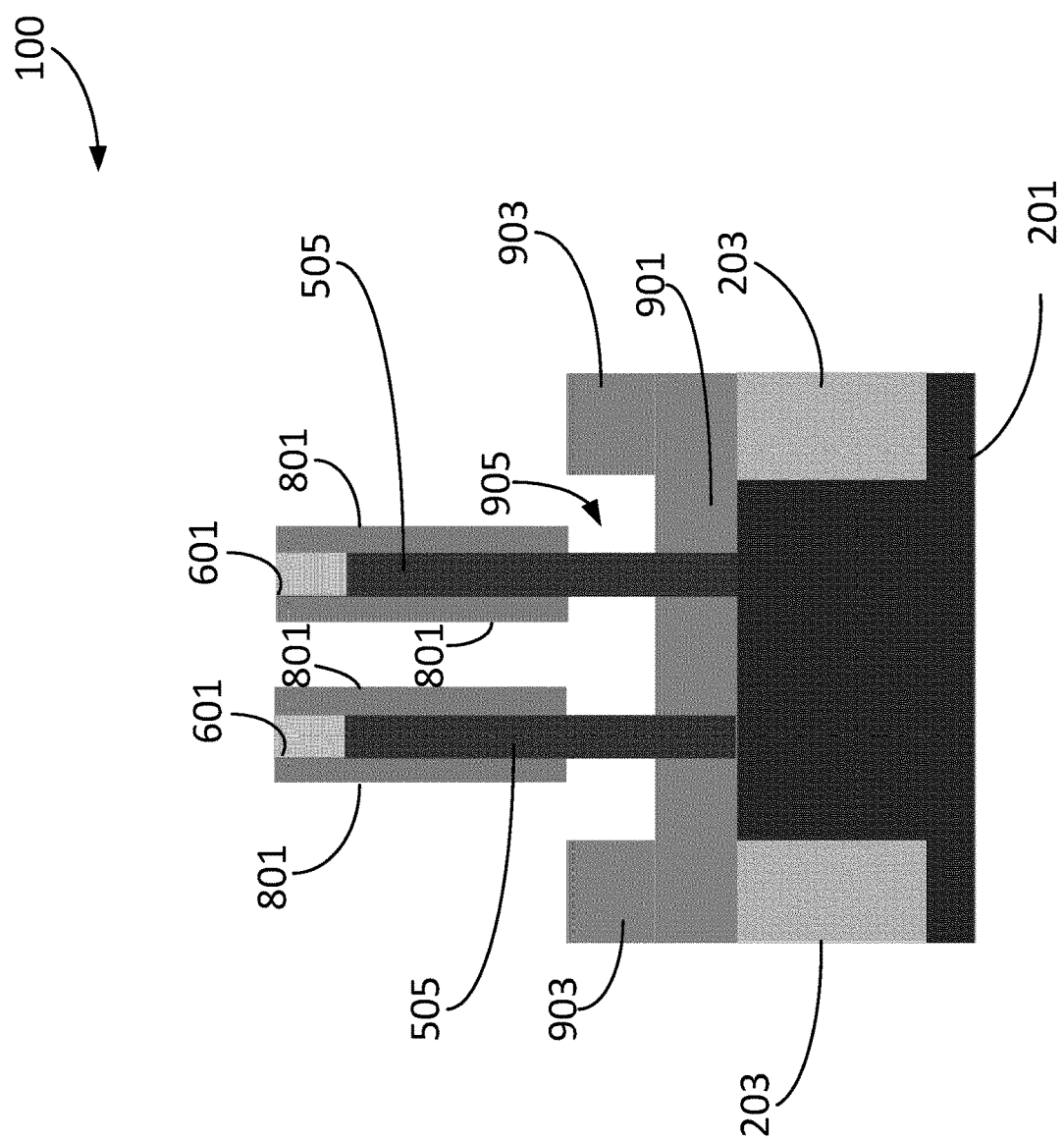
FIGS. 9A-9B are cross-sectional view schematic drawings of the vertical pillar structure (partially completed) illustrated in FIG. 1 after another oxide recess operation according to some embodiments.
Figure 9B:
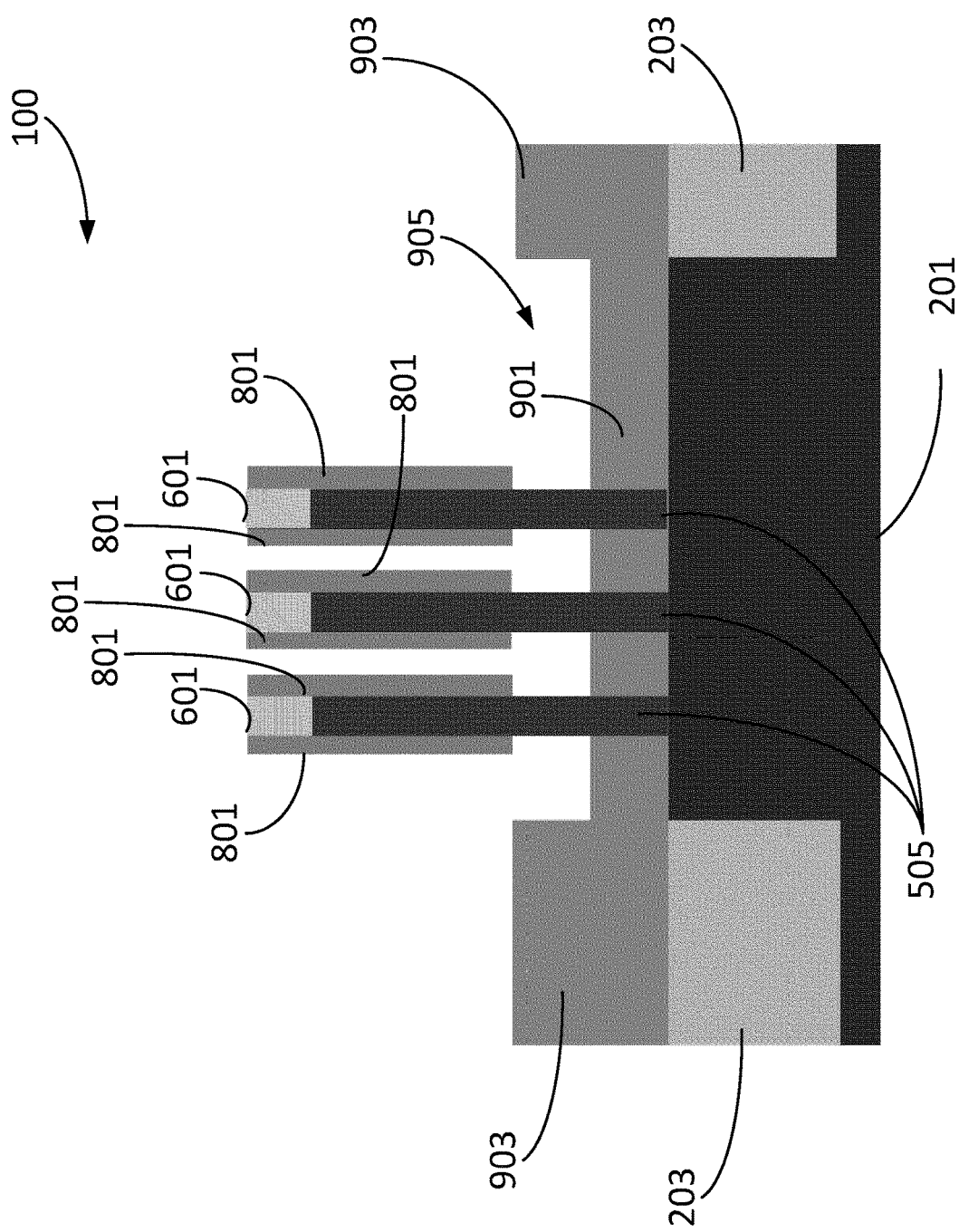

With reference to FIGS. 9A-9B, cross-sectional views of a partially completed vertical pillar structure 100 are depicted according to some embodiments. An oxide layer 901 is formed by recessing a portion of the oxide layer 701 of FIGS. 7A-7B according to some embodiments. The oxide layer 701 is recessed at a region 905 that surrounds the pillars 605 using a reverse image mask and etch operation (e.g., using an inverse mask of the mask used for the STI regions 203) according to some embodiments. The oxide material is removed by directional etching (e.g. REI) selective to silicon dioxide in some embodiments. In some embodiments, the directional etching is performed at higher angles (e.g., 45 degrees and above form the normal to the top surface of the substrate 201). The portions 903 of the oxide layer 901 are the portions of oxide layer that is not recessed in oxide layer 701 according to some embodiments. The portions 903 have the same patterns as the STI regions 203 according to some embodiments.

Figure 10A:
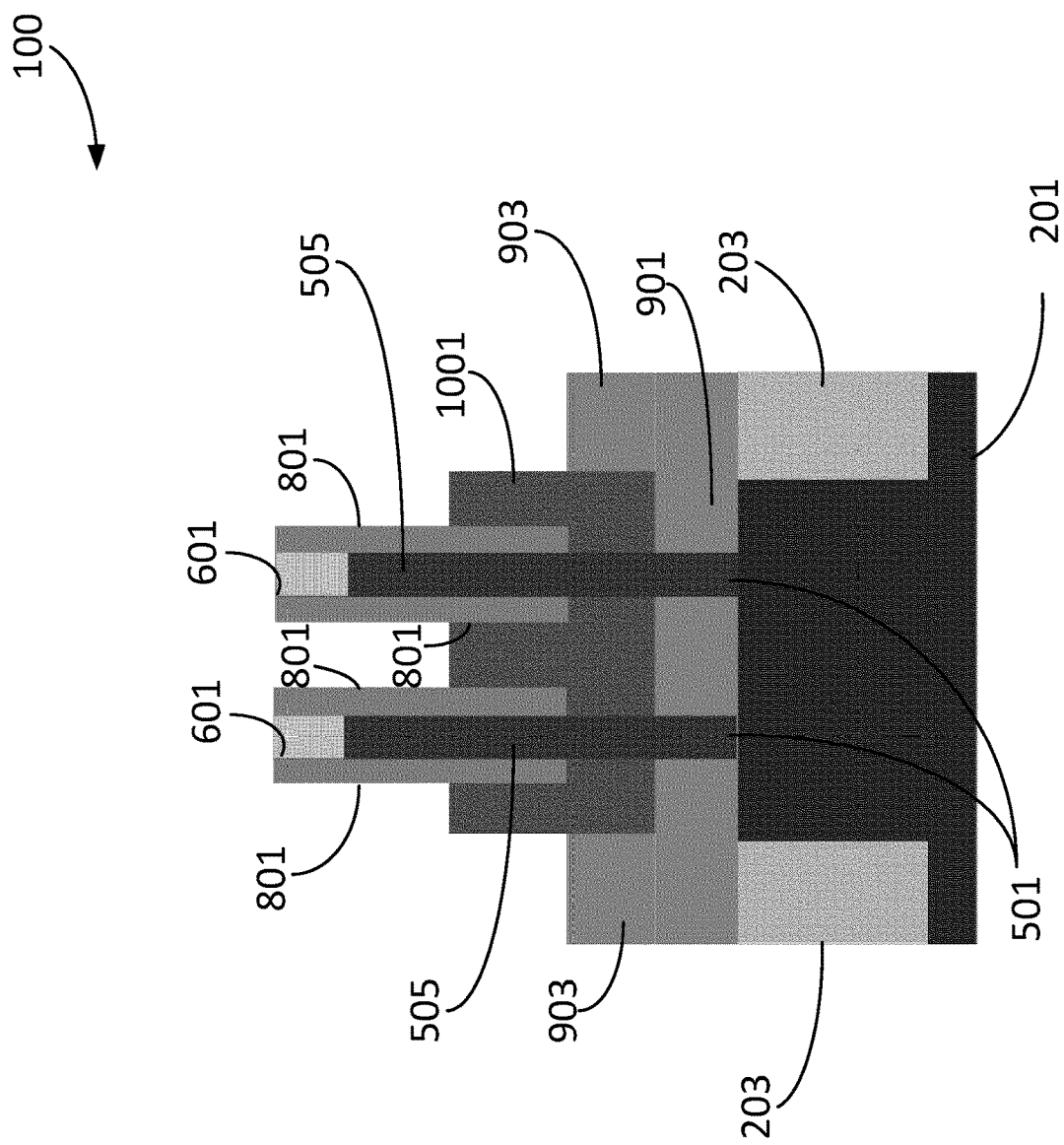
FIGS. 10A-10B are cross-sectional view schematic drawings of the vertical pillar structure (partially completed) illustrated in FIG. 1 after a drain epitaxial growth operation according to some embodiments.
Figure 10B:
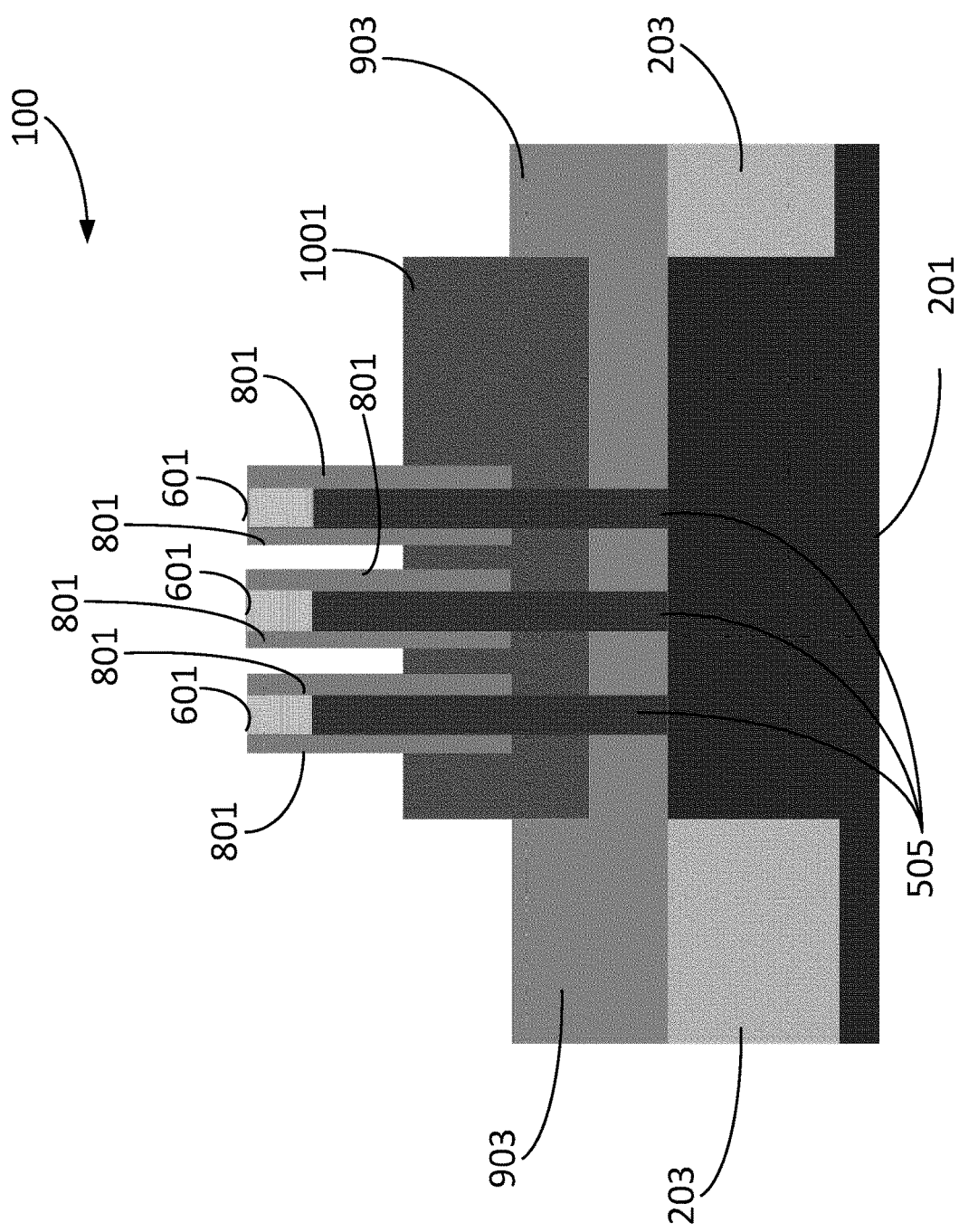

With reference to FIGS. 10A-10B, cross-sectional views of a partially completed vertical pillar structure 100 are depicted according to some embodiments. A drain section 1001 is formed by epitaxial growth in the region 905 according to some embodiments. The drain section 1001 is grown from the surface of the pillars 605 in the region 905 according to some embodiments. In this way, the drain section 1001 is near a bottom of the pillar 101 and is spaced from the defective regions 501 according to some embodiments. The drain section 1001 is formed to surround both the pillars 605 and a portion of the spacers 801 according to some embodiments. The drain section 1001 is formed using any suitable epitaxial materials (e.g., the material of the pillars 605 with any P-type, N-type dopants) according to some embodiments. The layer 901 advantageously provides a barrier between the defective regions 501 and the drain section 1001 in some embodiments.

Figure 11A:
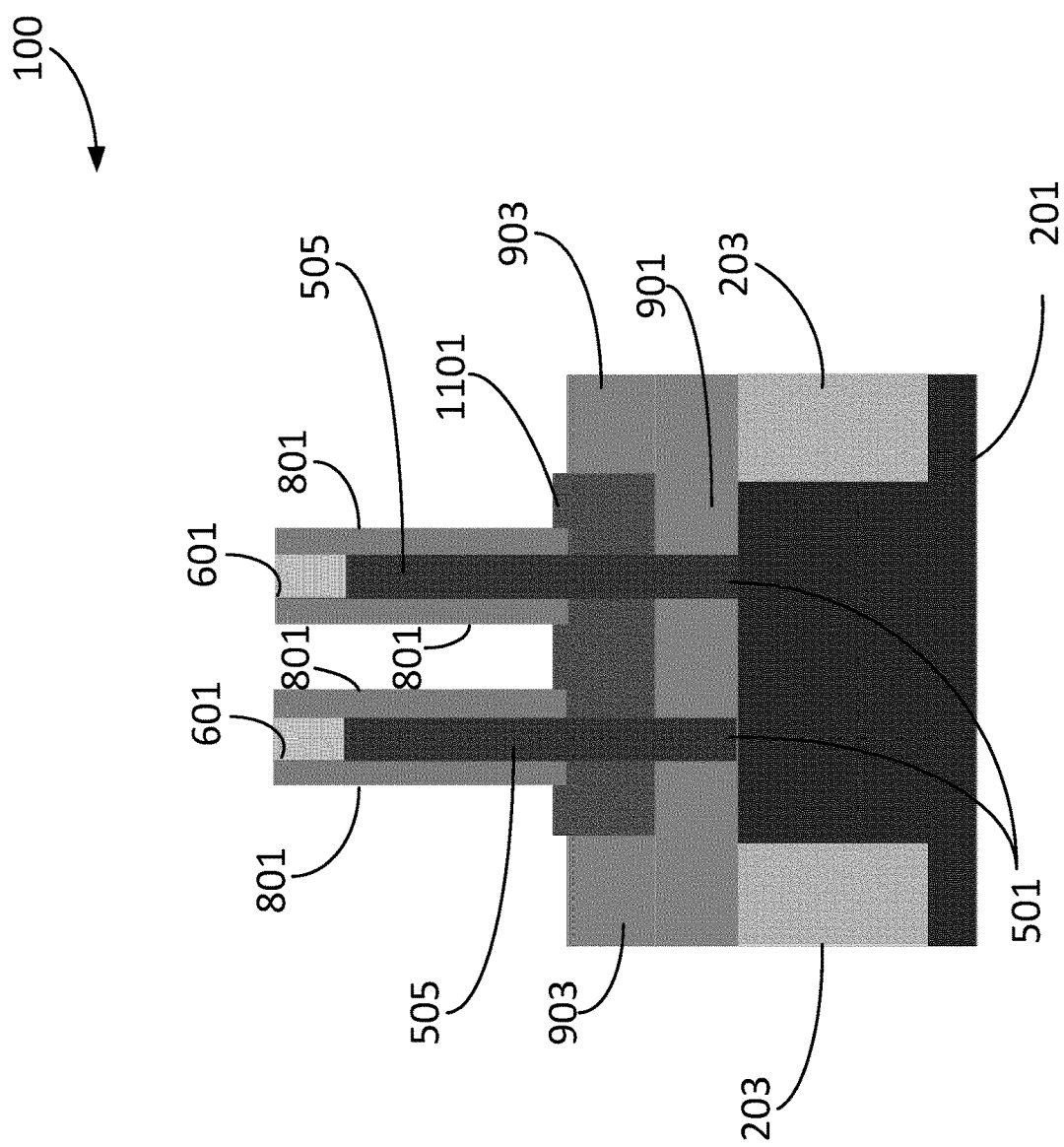
FIGS. 11A-11B are cross-sectional view schematic drawings of the vertical pillar structure (partially completed) illustrated in FIG. 1 after a drain epitaxial etch back operation according to some embodiments.
Figure 11B:
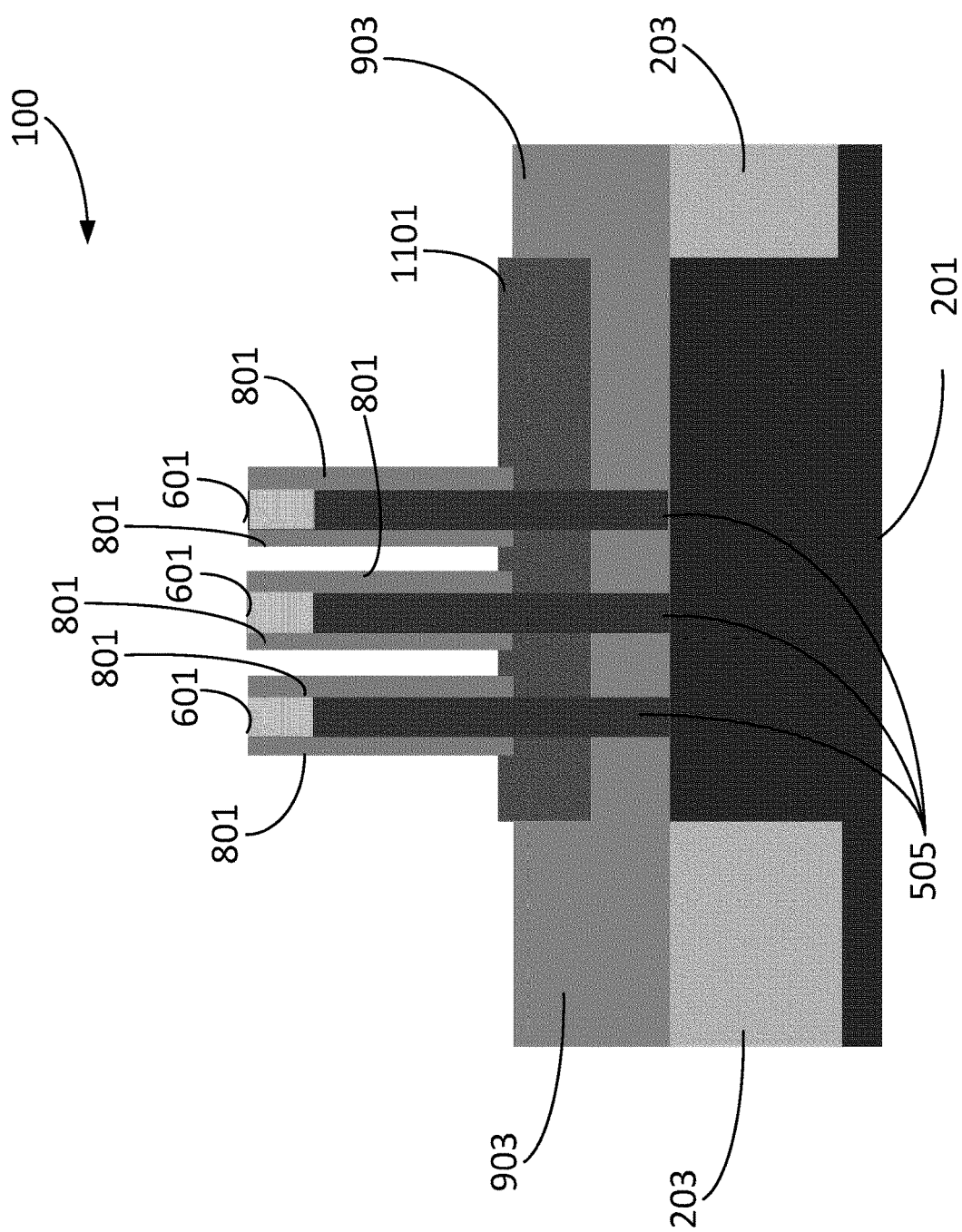

With reference to FIGS. 11A-11B, cross-sectional views of a partially completed vertical pillar structure 100 are depicted according to some embodiments. A drain section 1101 is formed by recessing the drain section 1001 according to some embodiments. The drain section 1001 is recessed by etching back the drain epitaxy to a level that is near the bottom of the spacers 801 such that the top of the drain section 1101 covers a smaller portion of the spacers 801 compared to the drain section 1001 (FIGS. 10A-B) according to some embodiments. The top surface of the drain section 1101 is above the top surface of the portions 903 according to some embodiments. The drain section 1101 is a source/drain region in some embodiments.

Figure 12A:
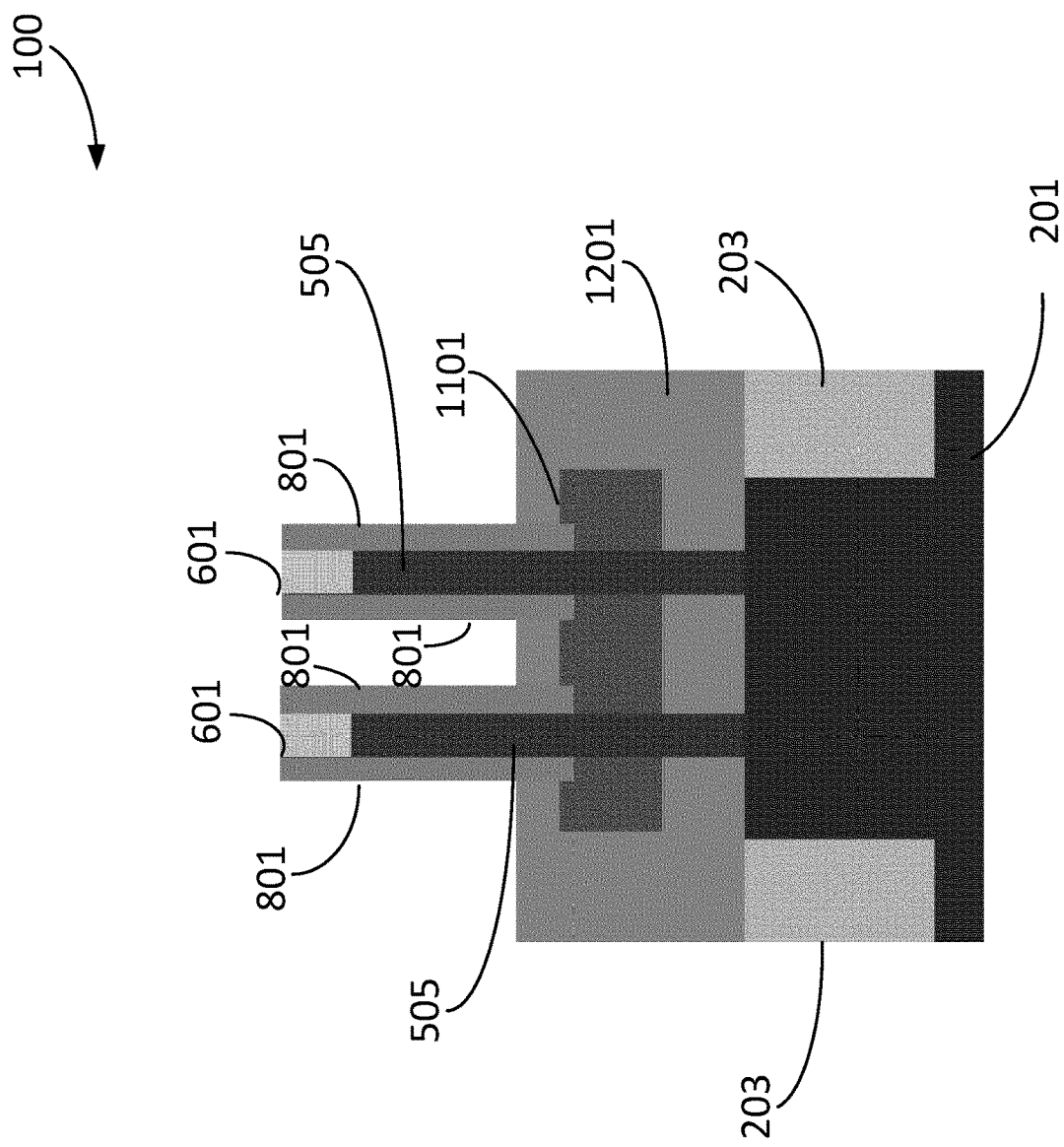
FIGS. 12A-12B are cross-sectional view schematic drawings of the vertical pillar structure (partially completed) illustrated in FIG. 1 after an oxide fill and recess operation according to some embodiments.
Figure 12B:
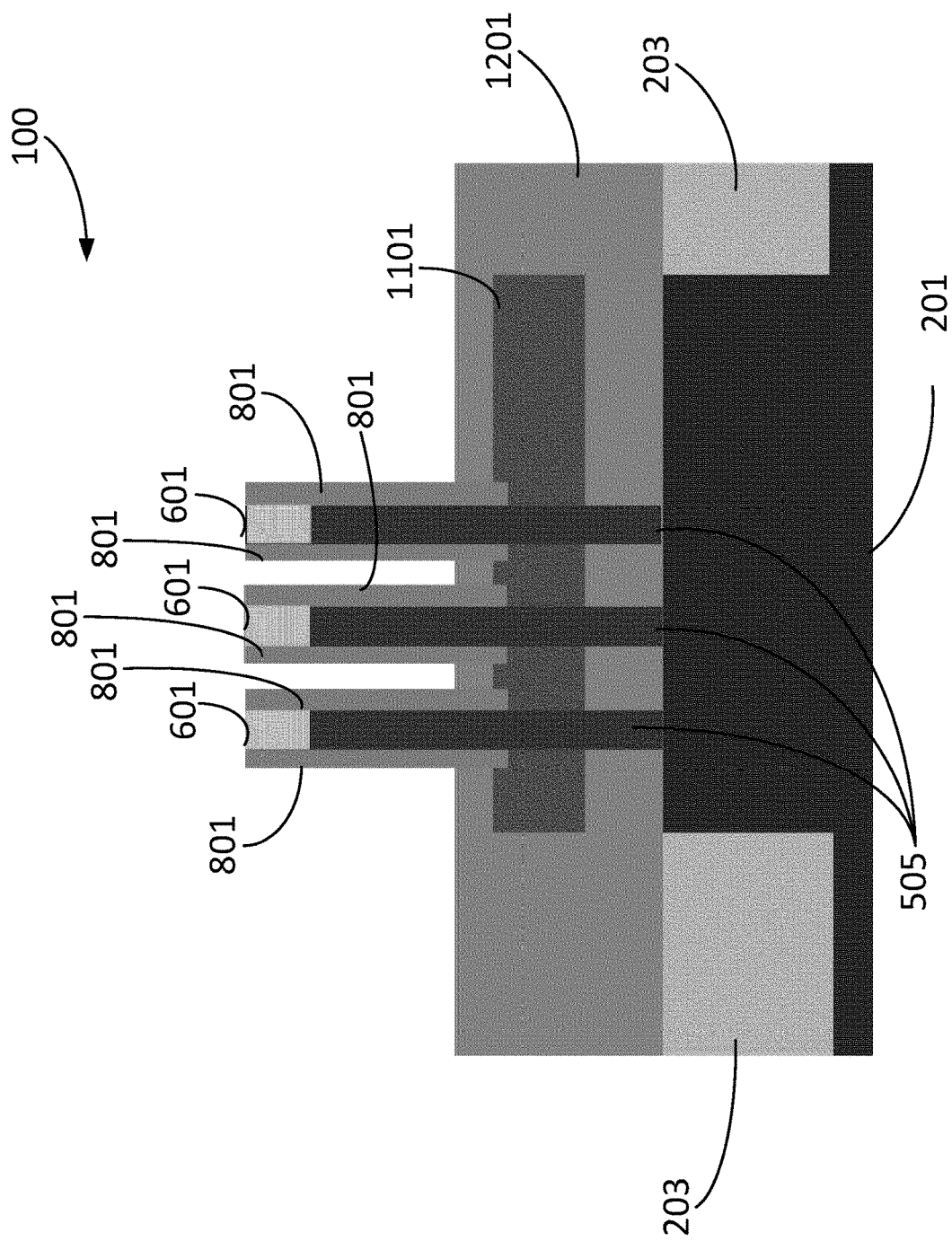

With reference to FIGS. 12A-12B, cross-sectional views of a partially completed vertical pillar structure 100 are depicted according to some embodiments. An oxide layer 1201 is formed by depositing oxide material on top of the portions 903 and the drain section 1101 according to some embodiments. The drain section 1101 is covered by the oxide layer 1201 according to some embodiments. In some embodiments, the oxide layer 1201 is formed with a desired height by a filling and recessing operation (e.g., depositing and etching) according to some embodiments.

Figure 13A:
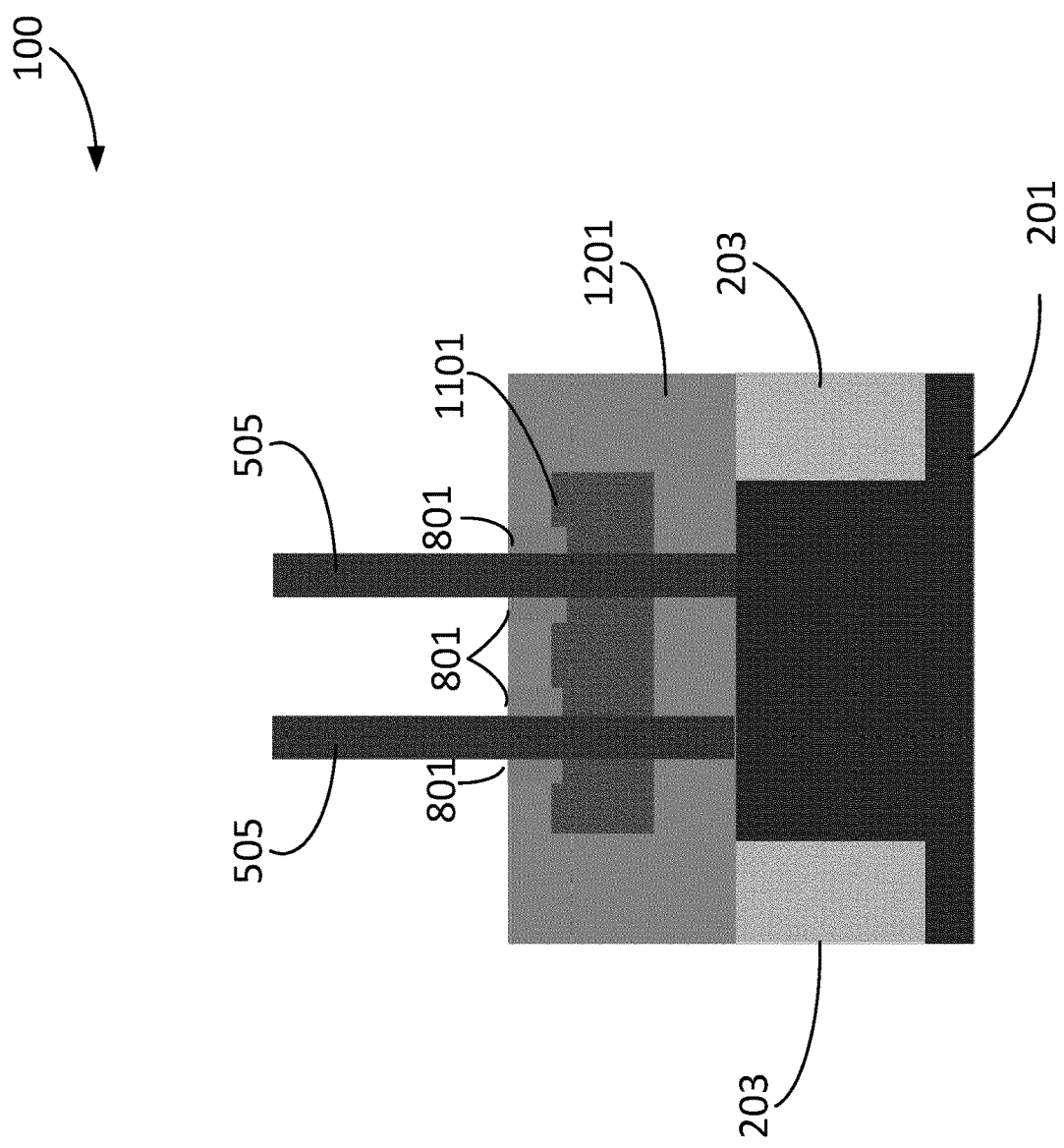
FIGS. 13A-13B are cross-sectional view schematic drawings of the vertical pillar structure (partially completed) illustrated in FIG. 1 after a silicon nitride removal operation according to some embodiments.
Figure 13B:
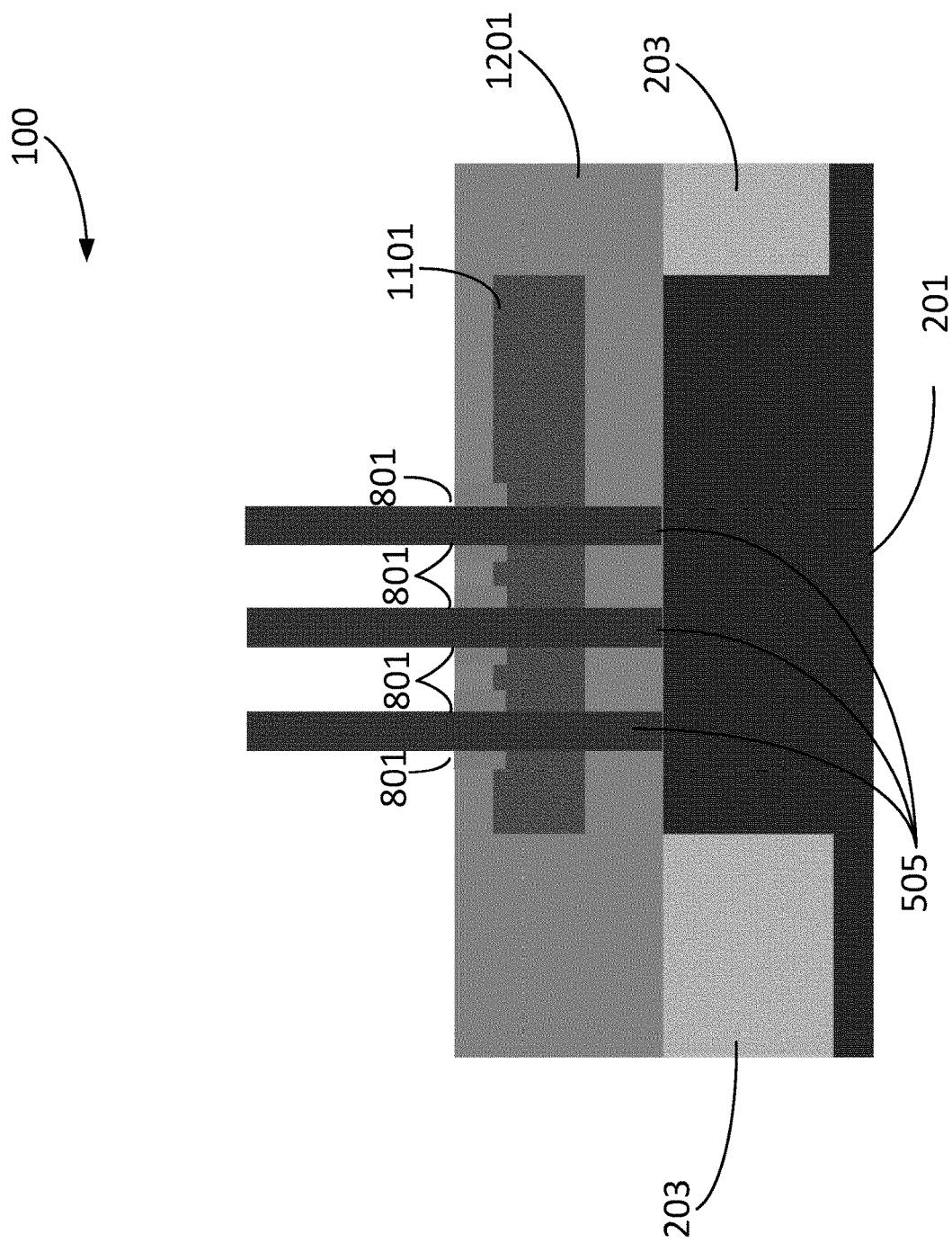

With reference to FIGS. 13A-13B, cross-sectional views of a partially completed structure vertical pillar structure 100 are depicted according to some embodiments. In some embodiments, all dielectric material (e.g., the caps 601, the exposed portions of the spacers 801) that surrounds the pillars 605 is removed. The dielectric material is removed by etching selective to the dielectric material to a depth controlled by process controls.

Figure 14A:
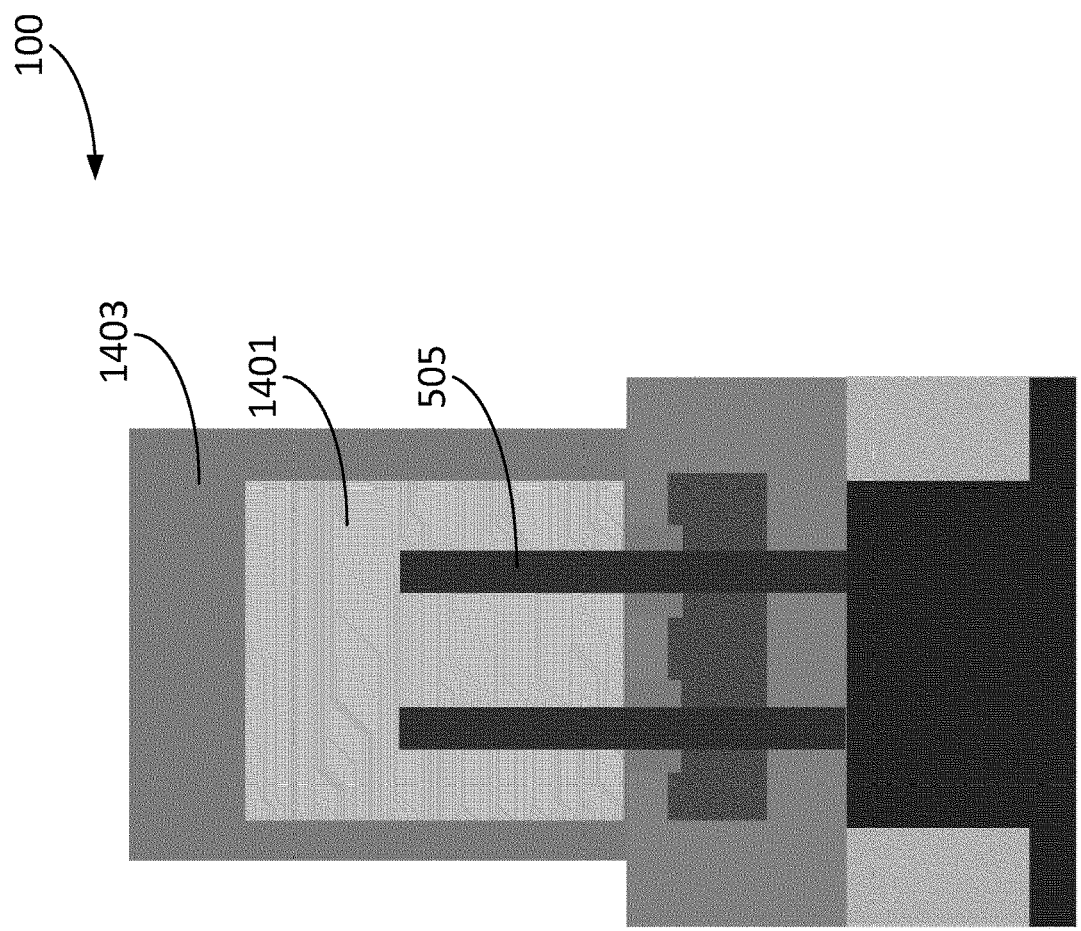
FIGS. 14A-14B are cross-sectional view schematic drawings of the vertical pillar structure (partially completed) illustrated in FIG. 1 after a sacrificial gate and spacer formation operation according to some embodiments.
Figure 14B:
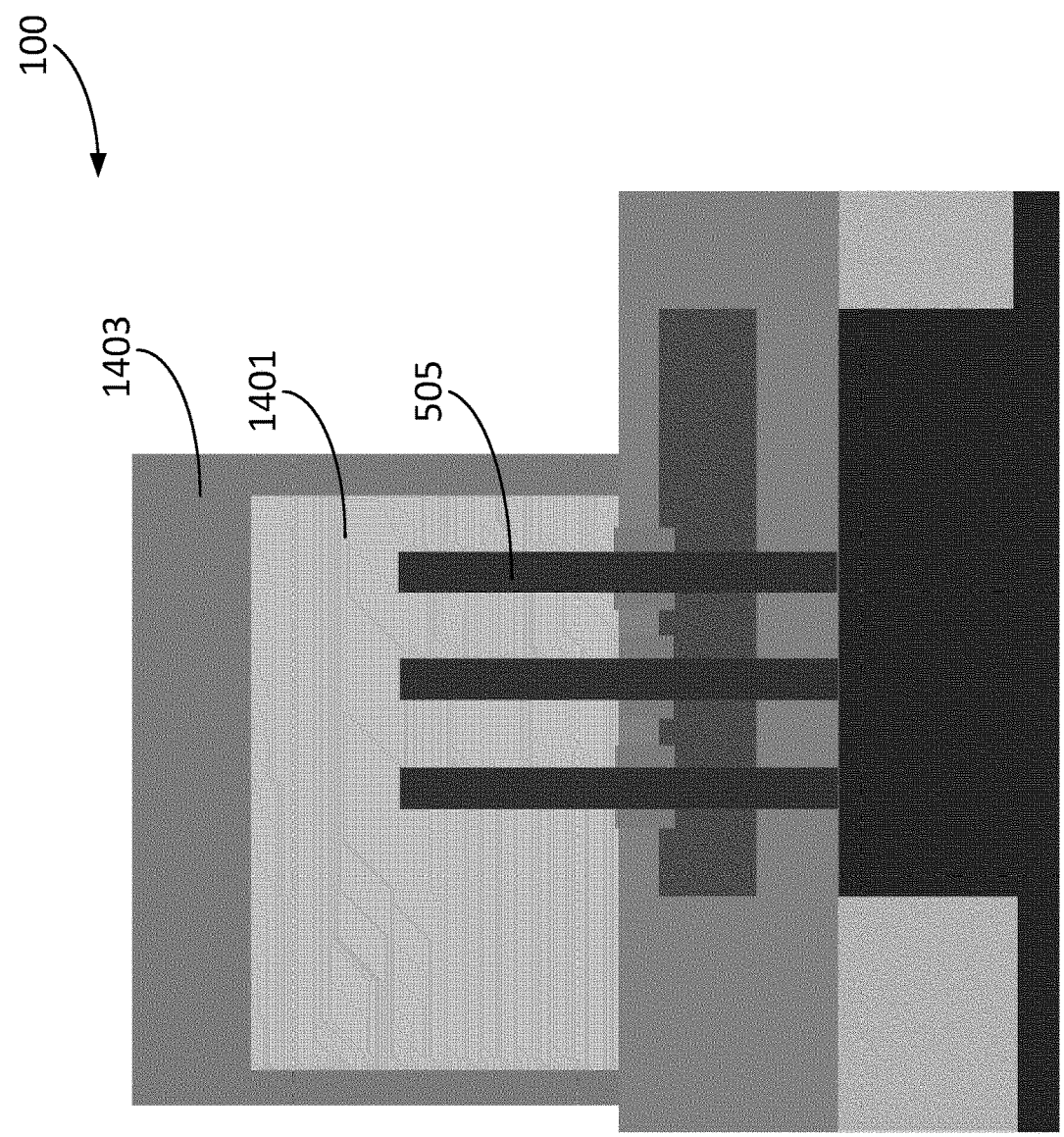

With reference to FIGS. 14A-14B, cross-sectional views of a partially completed vertical pillar structure 100 are depicted according to some embodiments. In some embodiments, a sacrificial or dummy gate 1401 is formed around the pillars 605. In some embodiments, the dummy gate 1401 is formed by depositing and patterning polysilicon material. In some embodiments, the dummy gate 1401 is formed with a desired height such that the top surface of the dummy gate 1401 is above the top surface of the pillars 605. In some embodiments, a spacer layer 1403 is deposited to cover the dummy gate 1401. In some embodiments, the spacer layer 1403 is formed with an insulating material, for example, silicon dioxide, silicon nitride, SiOCN, or SiBCN. In some embodiments, the dummy gate 1401 is formed at a location that is above one end of the drain 1101 and is not above the other end of the drain 1101.

Figure 15A:
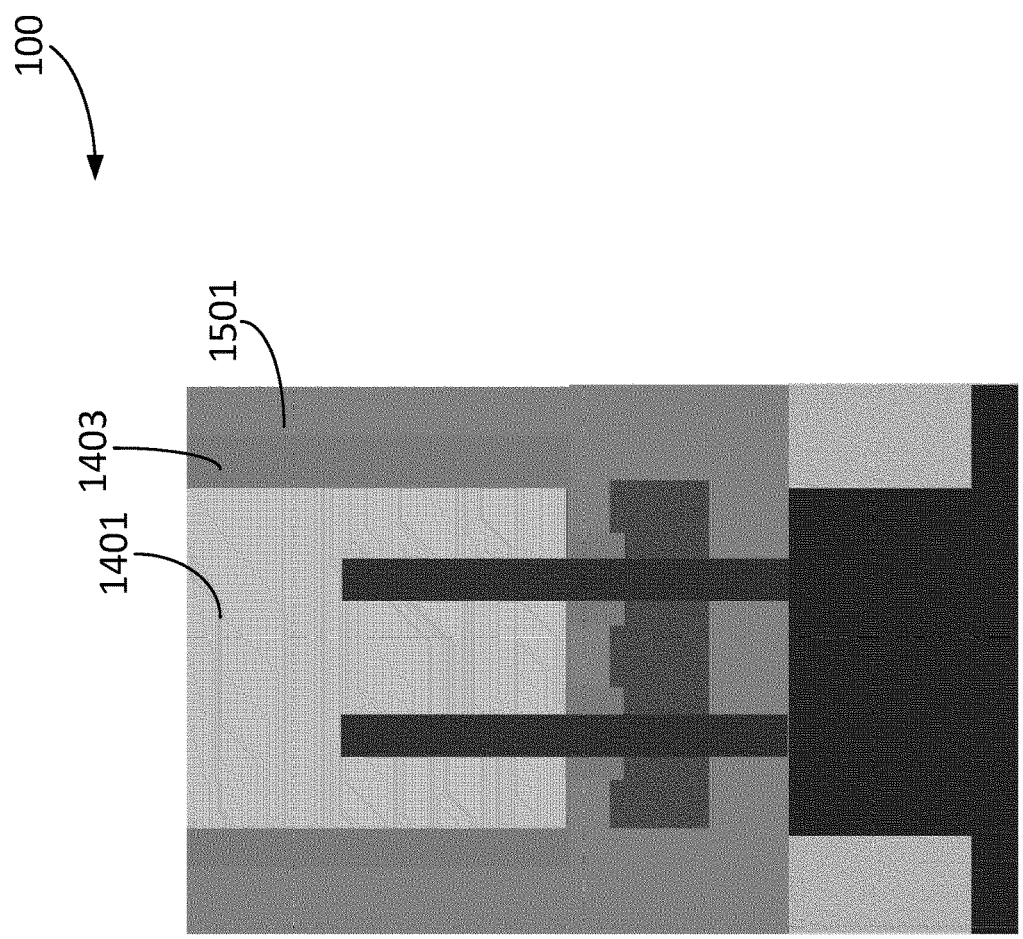
FIGS. 15A-15B are cross-sectional view schematic drawings of the vertical pillar structure (partially completed) illustrated in FIG. 1 after an oxide interlevel dielectric (ILD) fill and CMP operation according to some embodiments.
Figure 15B:
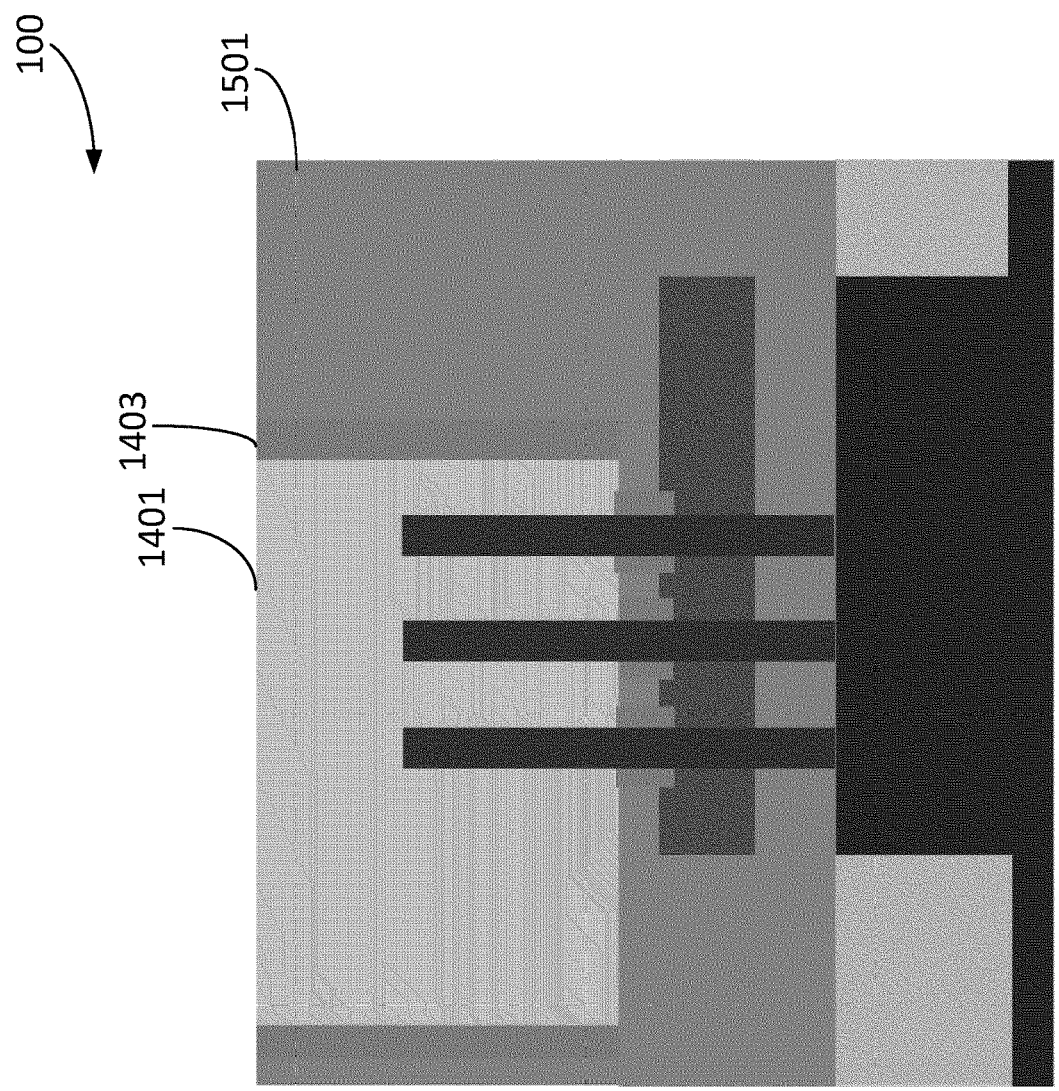

With reference to FIGS. 15A-15B, cross-section views of a partially completed vertical pillar structure 100 are depicted according to some embodiments. In some embodiments, an oxide layer 1501 is formed on top of the spacer 1403 and the oxide layer 1201, so that the oxide layer 1501 is aligned with the oxide layer 1201 and covers the whole spacer 1403. In some embodiments, a polishing process (e.g., a CMP process) is applied to the top of the oxide layer 1501 to remove the top surface of the oxide layer 1501 and the top surface of the spacer 1403 to expose the top surface of the dummy gate 1401.

Figure 16A:
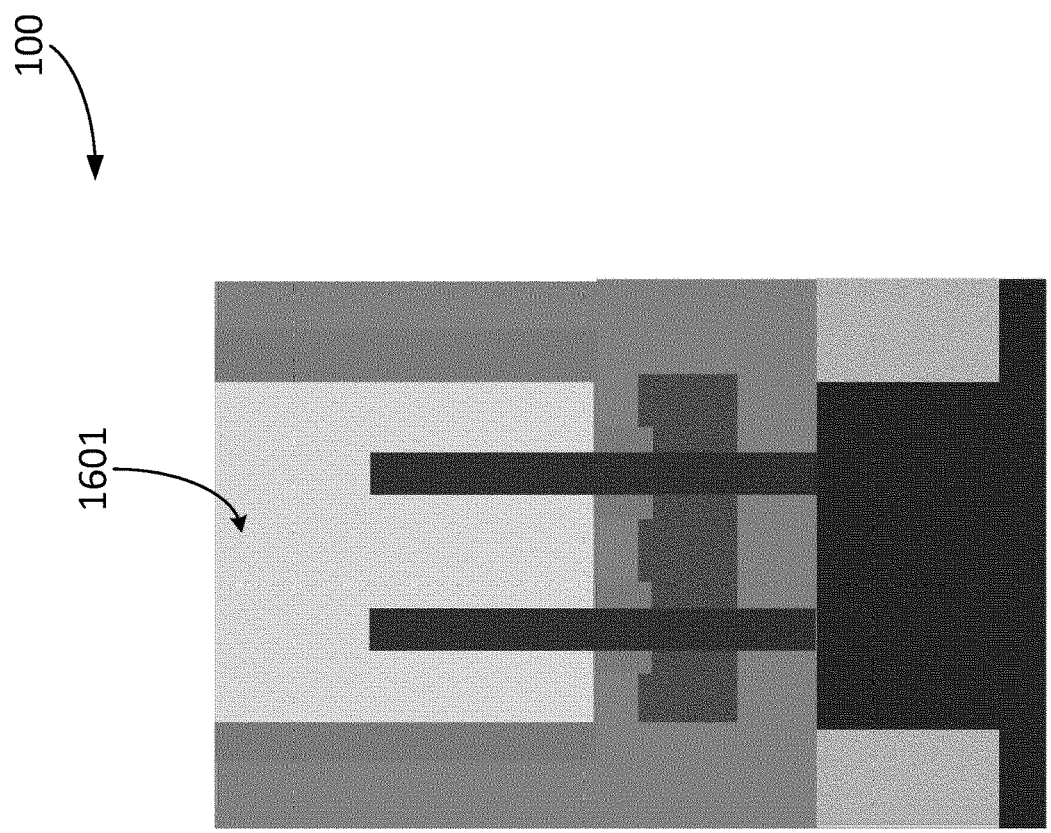
FIGS. 16A-16B are cross-sectional view schematic drawings of the vertical pillar structure (partially completed) illustrated in FIG. 1 after a sacrificial gate removal operation according to some embodiments.
Figure 16B:
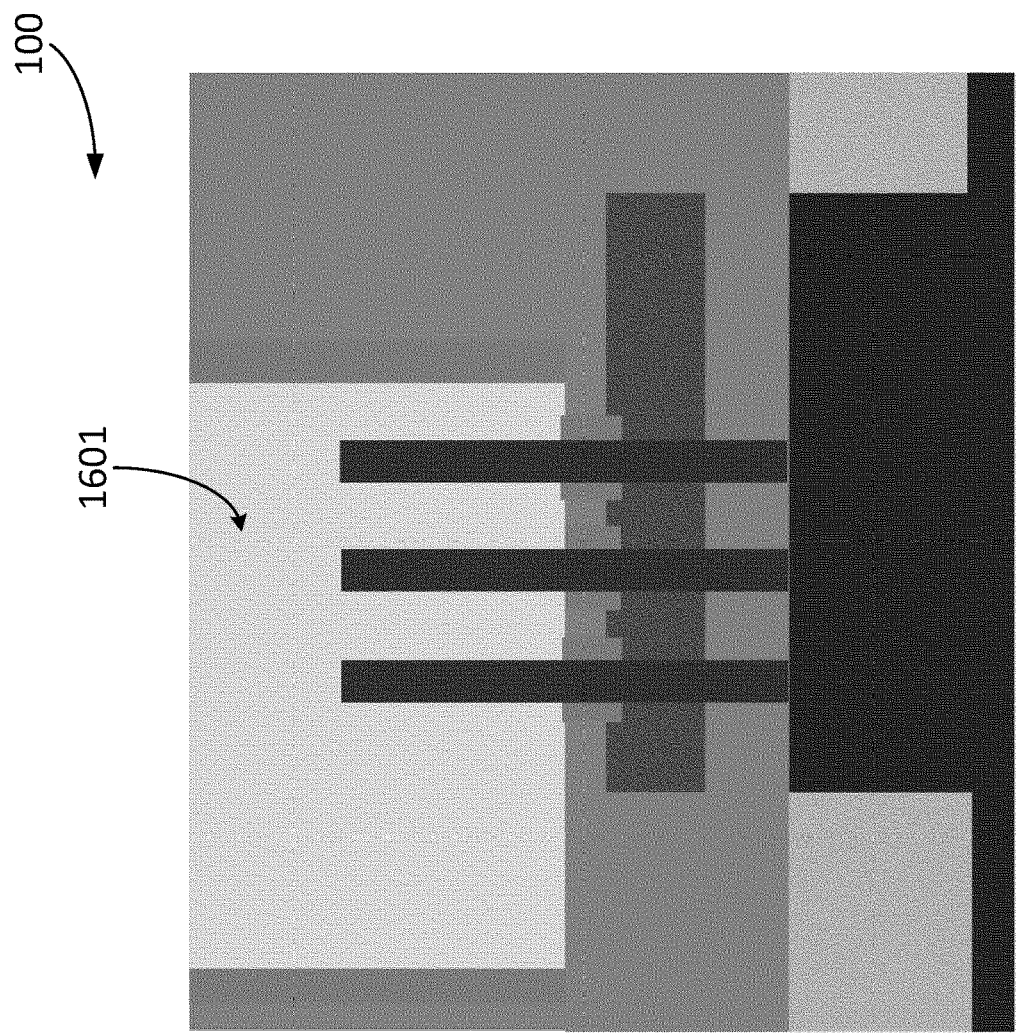

With reference to FIGS. 16A-16B, cross-sectional views of a partially completed vertical pillar structure 100 are depicted according to some embodiments. In some embodiments, the dummy gate 1401 is removed by etching or pulling the dummy gate from the vertical pillar structure 100 to form a space 1601.

Figure 17A:
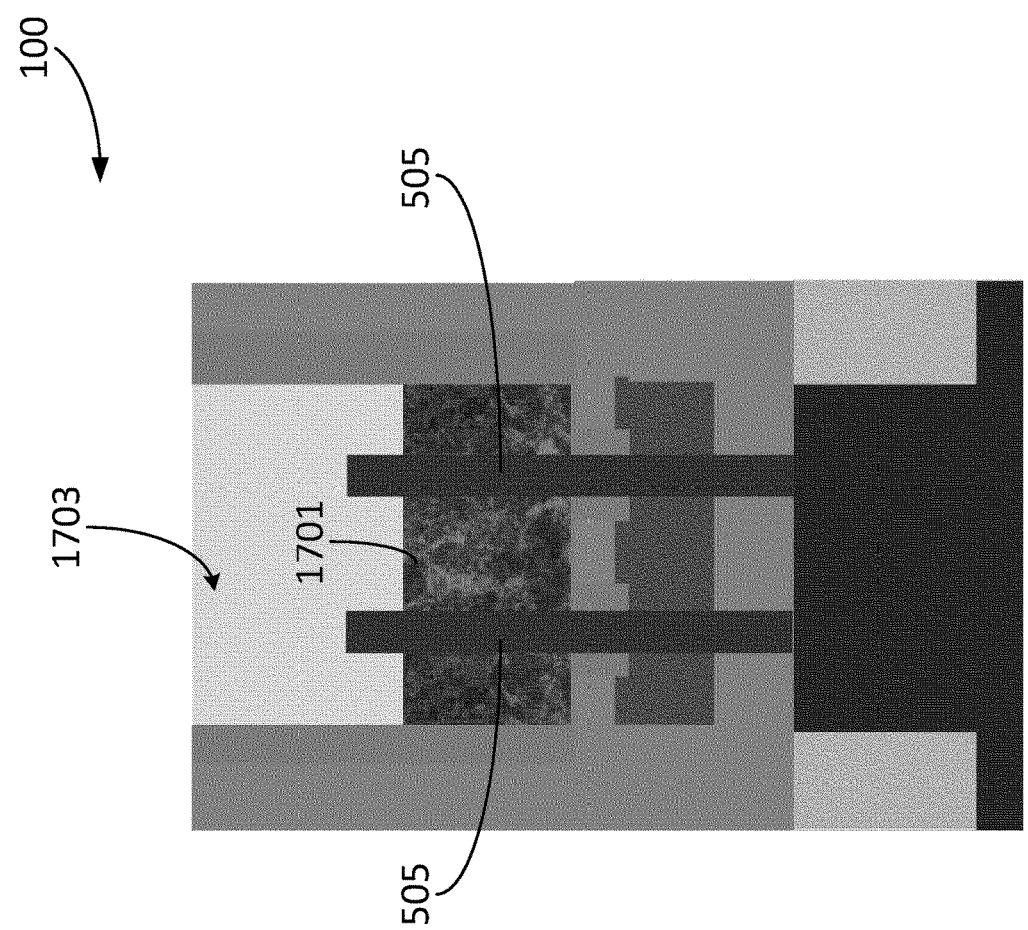
FIGS. 17-17B are cross-sectional view schematic drawings of the vertical pillar structure (partially completed) illustrated in FIG. 1 after a replacement metal gate (RMG) formation and recess operation according to some embodiments.
Figure 17B:
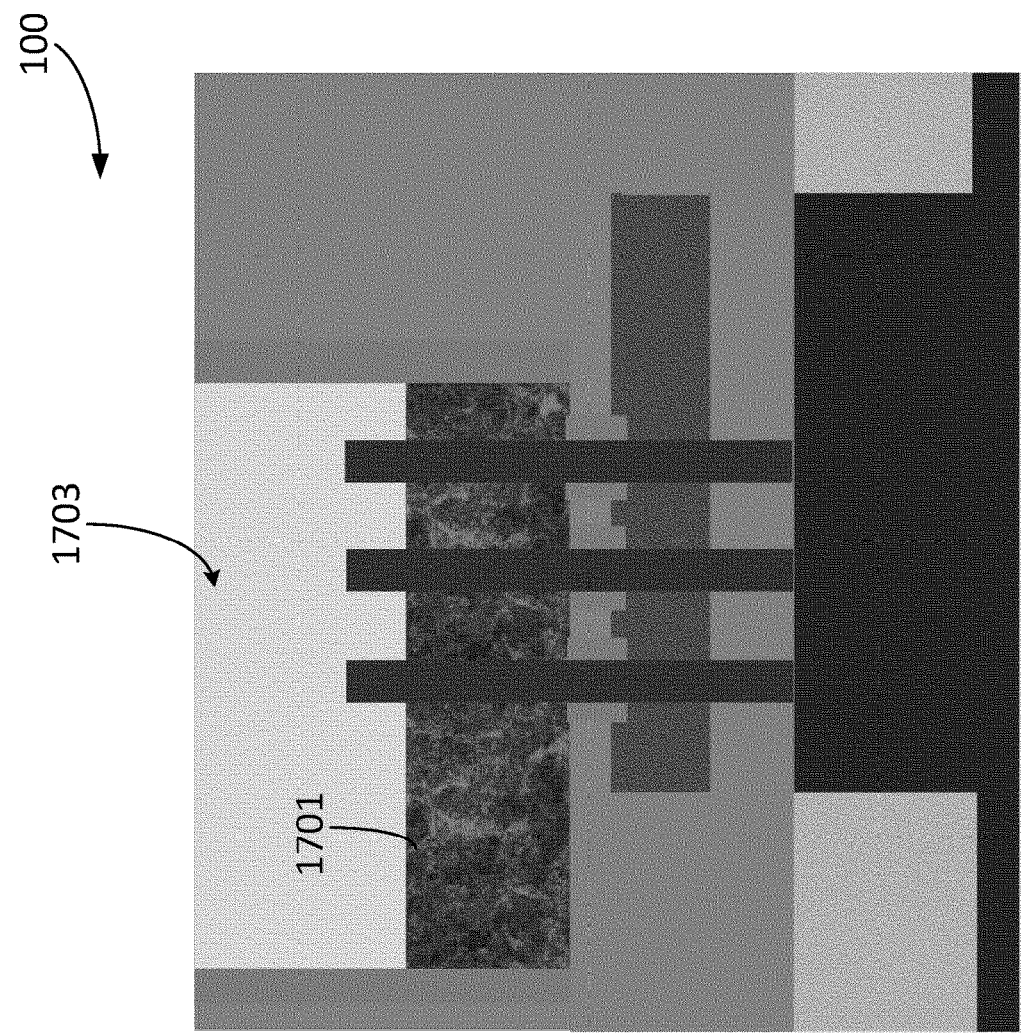

With reference to FIGS. 17A-17B, cross-sectional views of a partially completed vertical pillar structure 100 are depicted according to some embodiments. In some embodiments, a replacement metal gate (RMG) 1701 is formed within the space 1601 by depositing suitable metal gate material into the space 1601. In some embodiments, the RMG 1701 is recessed to a level such that the top surface of the RMG 701 is below the top surface of the pillars 606. In some embodiments, after forming the RMG 1701, a space 1703 is formed above the RMG within the space 1601. The RMG 1701 is an aluminum, copper, alloy thereof, or metal stack in some embodiments.

Figure 18A:
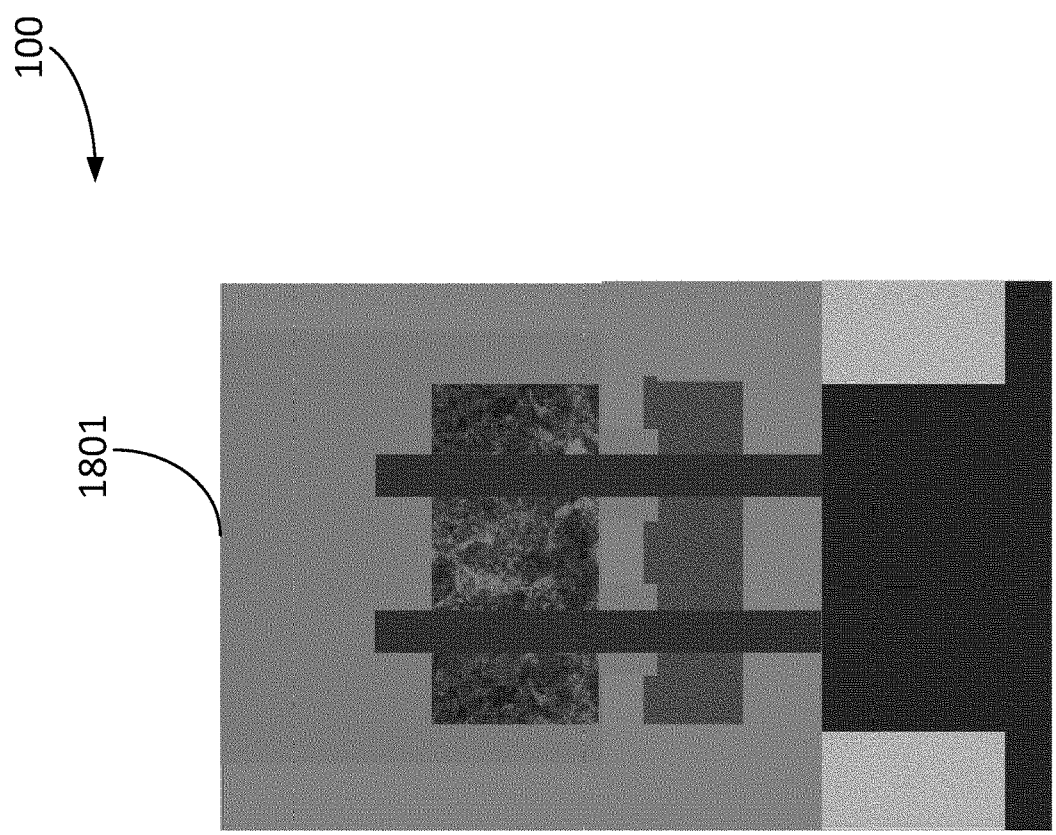
FIGS. 18A-18B are cross-sectional view schematic drawings of the vertical pillar structure (partially completed) illustrated in FIG. 1 after a cap formation operation according to some embodiments.
Figure 18B:
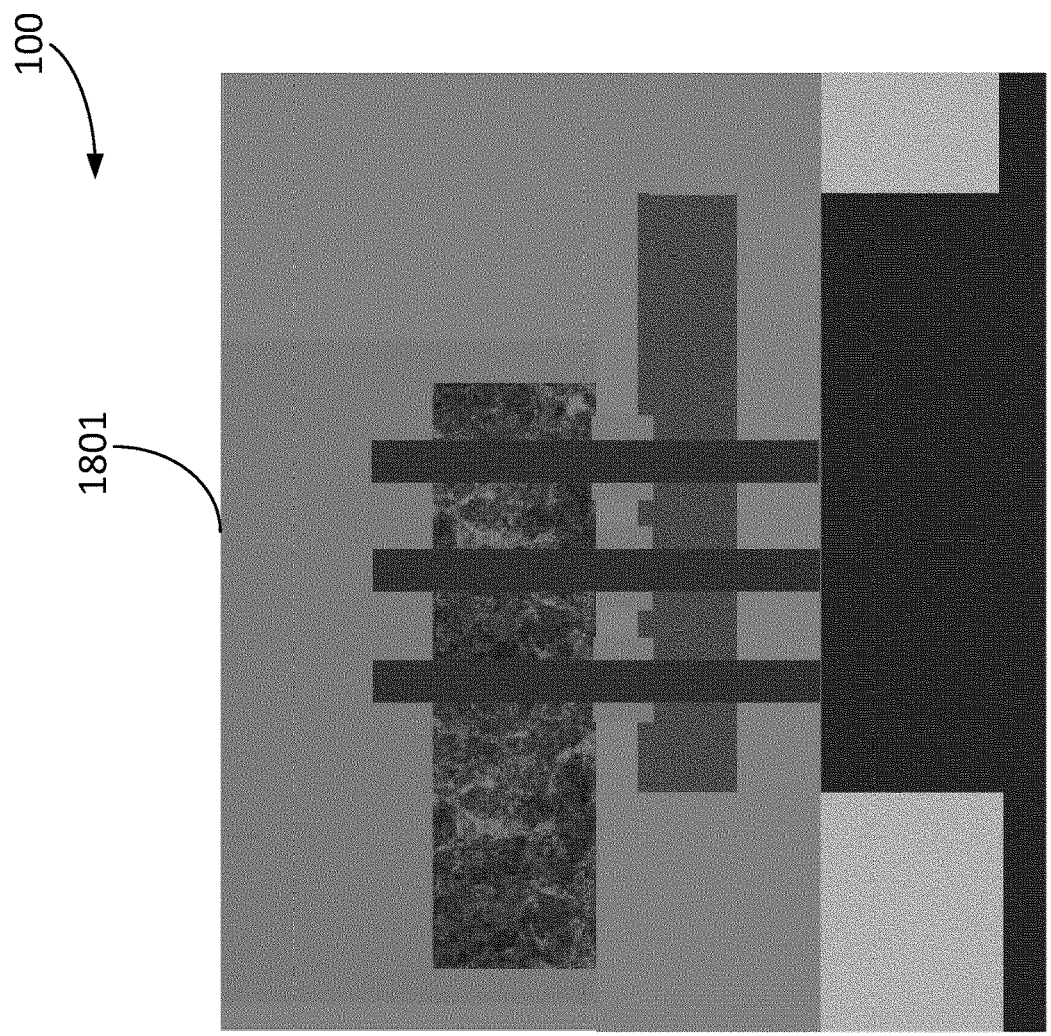

With reference to FIGS. 18A-18B, cross-sectional views of a partially completed vertical pillar structure 100 are depicted according to some embodiments. In some embodiments, a spacer layer 1801 is formed by depositing the same dielectric material as the spacer 1403 into the space 1703.

Figure 19A:
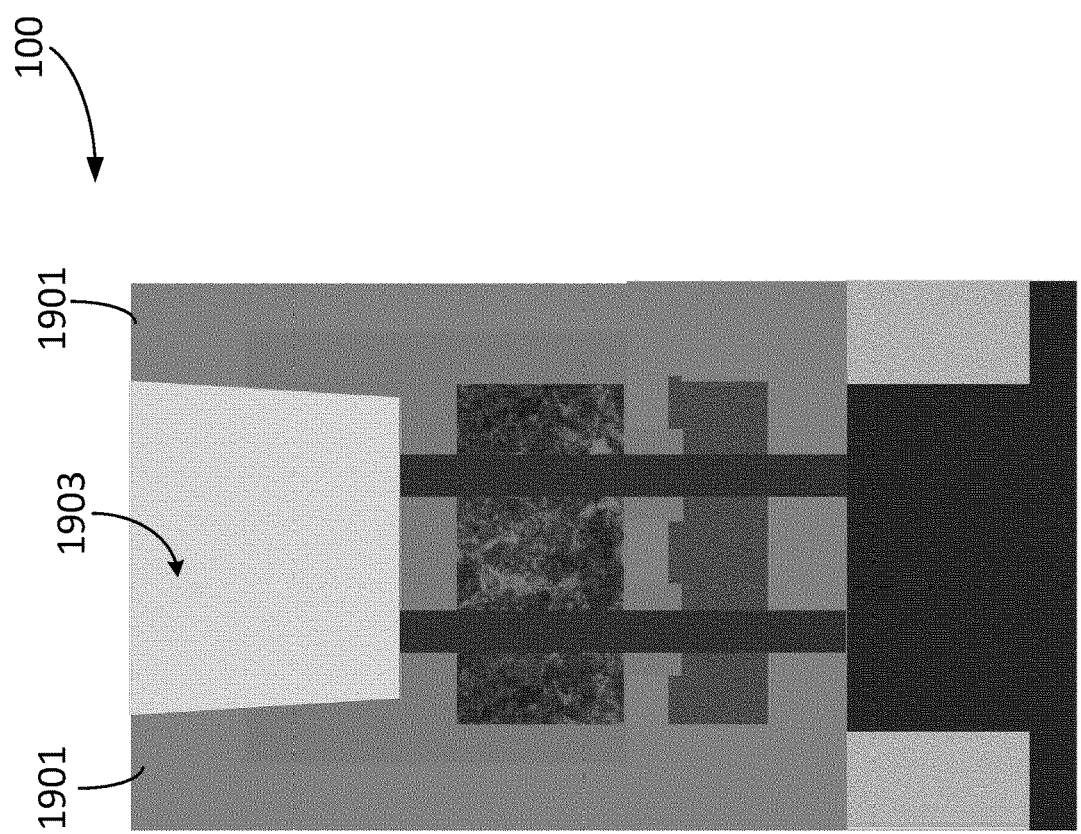
FIGS. 19A-19B are cross-sectional view schematic drawings of the vertical pillar structure (partially completed) illustrated in FIG. 1 after an IDL deposition and source contact etch operation according to some embodiments.
Figure 19B:
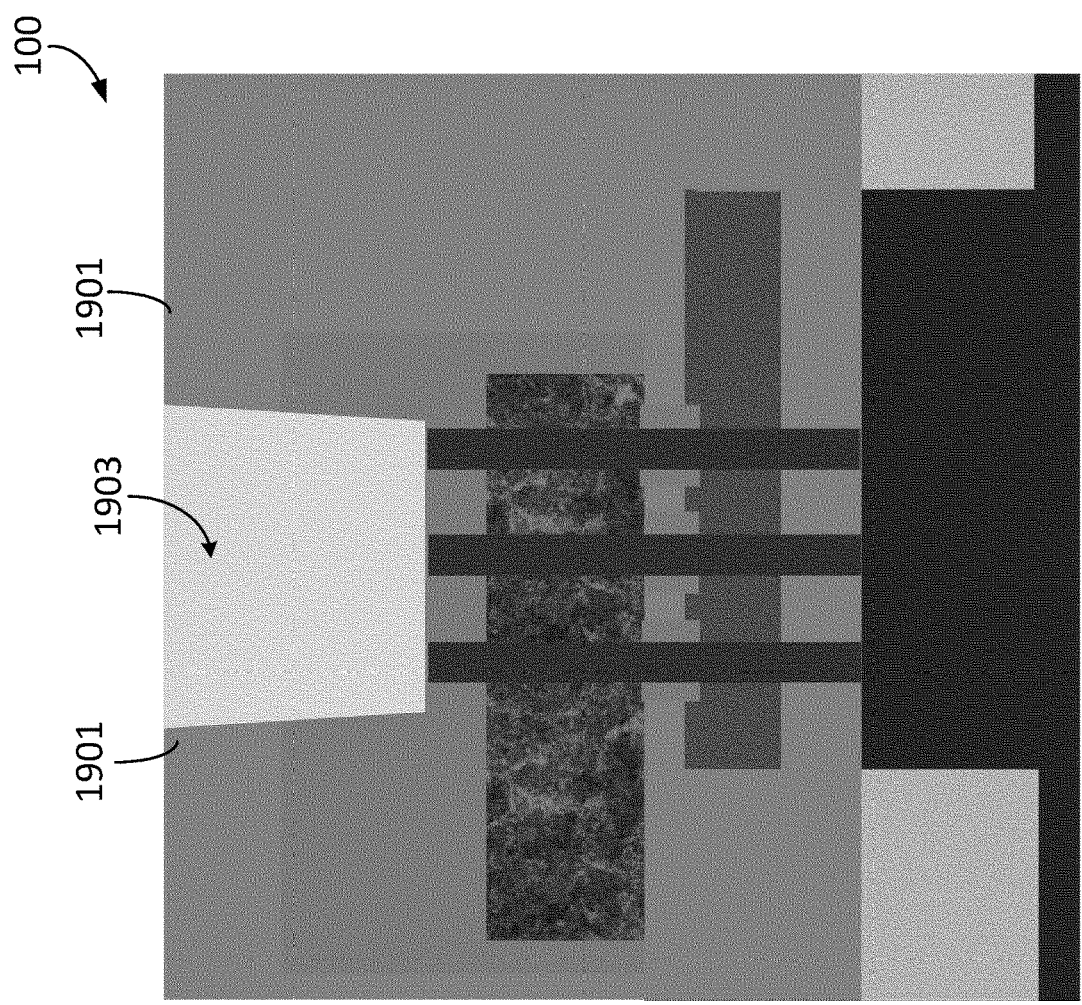

With reference to FIGS. 19A-19B, cross-sectional views of a partially completed vertical pillar structure 100 are depicted according to some embodiments. In some embodiments, an interlayer dielectric (ILD) layer 1901 is formed by depositing dielectric material (e.g., same dielectric material as the spacer 1403) over the top surface of the oxide layer 1501 and the spacer layer 1801. In some embodiments, a space 1903 is formed by an etching process applied over the ILD layer 1901. In some embodiments, the space 1903 is formed such that the top surface of the pillars 605 is exposed.

Figure 20B:
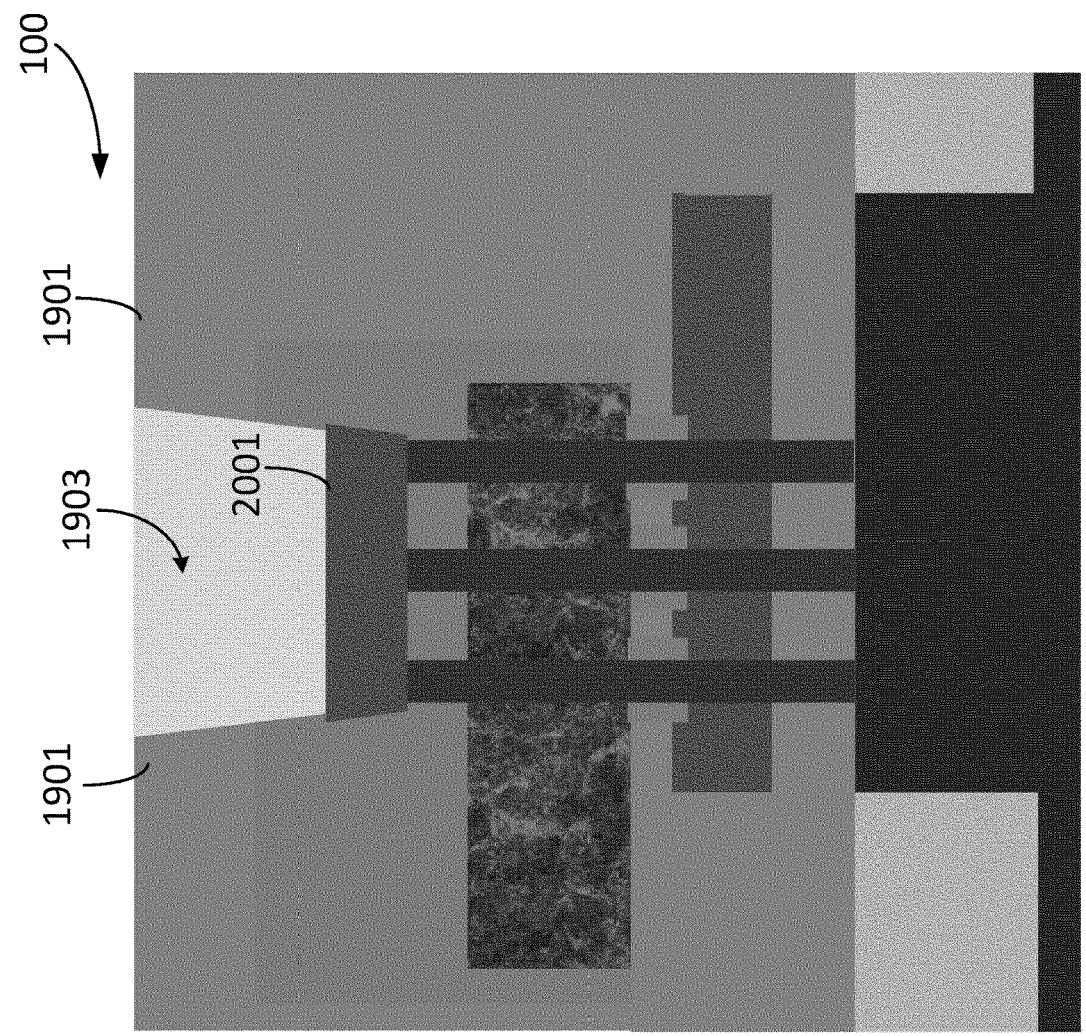

With reference to FIGS. 20A-20B, cross-sectional views of a partially completed vertical pillar structure 100 are depicted according to some embodiments. In some embodiments, a source section 2001 is formed to contact the top surface of the pillars 605. The source section 2001 is formed using any suitable material e.g., any semiconductor material). The source region or section 2001 is formed by epitaxial growth (with P-type, N-type dopants) according to some embodiments. In some embodiments, the source section 2001 is connected to the drain section 1001 through the pillars 605. The source section 2001 is a source/drain region ins some embodiments.

Figure 21A:
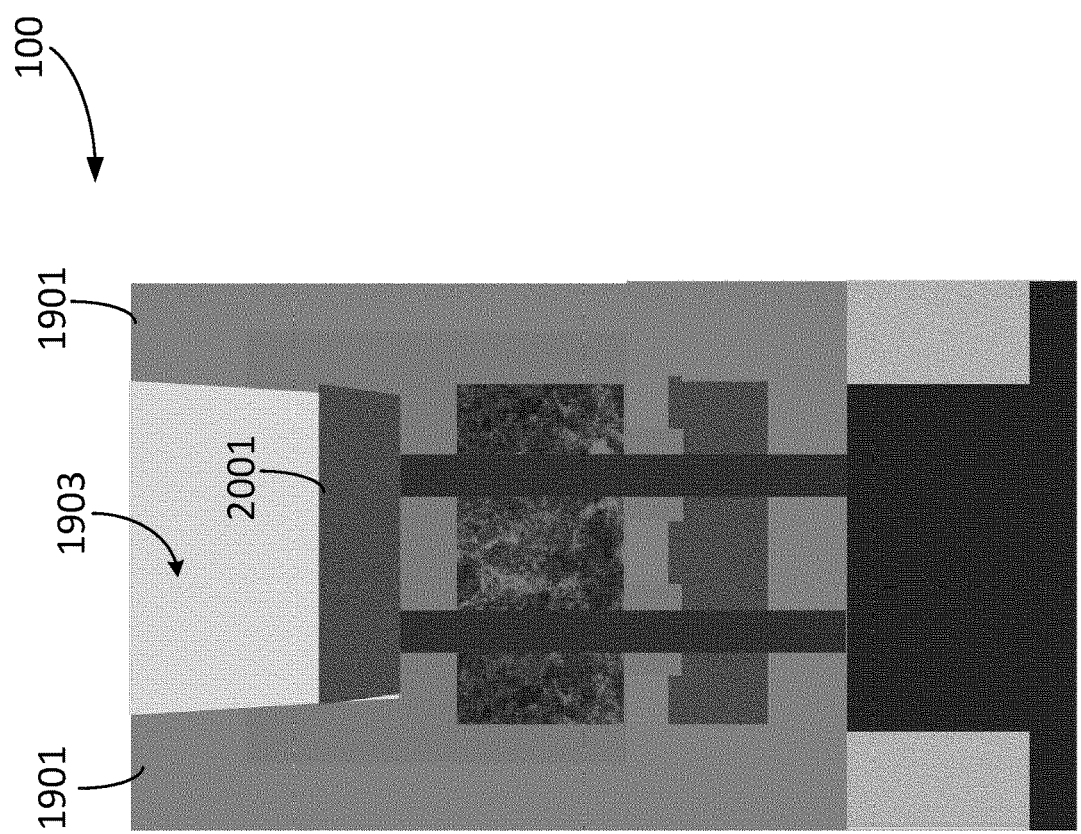
FIGS. 21A-21B are cross-sectional view schematic drawings of the vertical pillar structure (partially completed) illustrated in FIG. 1 after a drain contact formation operation according to some embodiments.
Figure 21B:
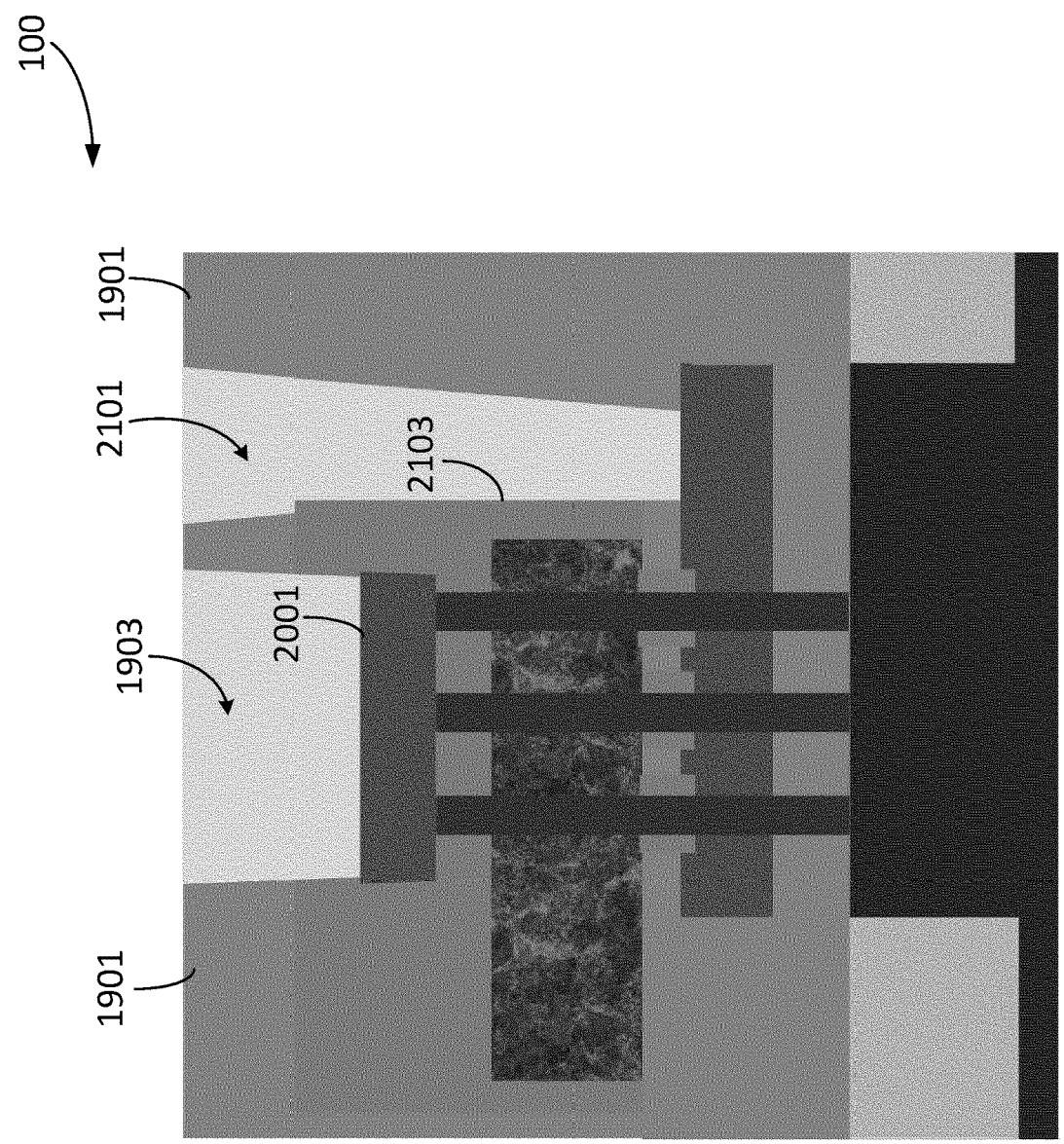

With reference to FIGS. 21A-21B, cross-sectional views of a partially completed vertical pillar structure 100 are depicted according to some embodiments. In some embodiments, a drain contact via or aperture 2101 is formed. In some embodiments, the drain contact aperture 2101 is formed in a self-aligned operation. In some embodiments, the drain contact aperture 2101 is formed by etching from the surface of the spacer layer 1801 along a sidewall 2103 of the spacer layer 2103 until reaching the top surface of the drain region or section 1101. In some embodiments, the drain contact aperture 2101 is formed by lithographical patterning and selective etching along the sidewall 2103 of the spacer layer 1801.

Figure 22A:
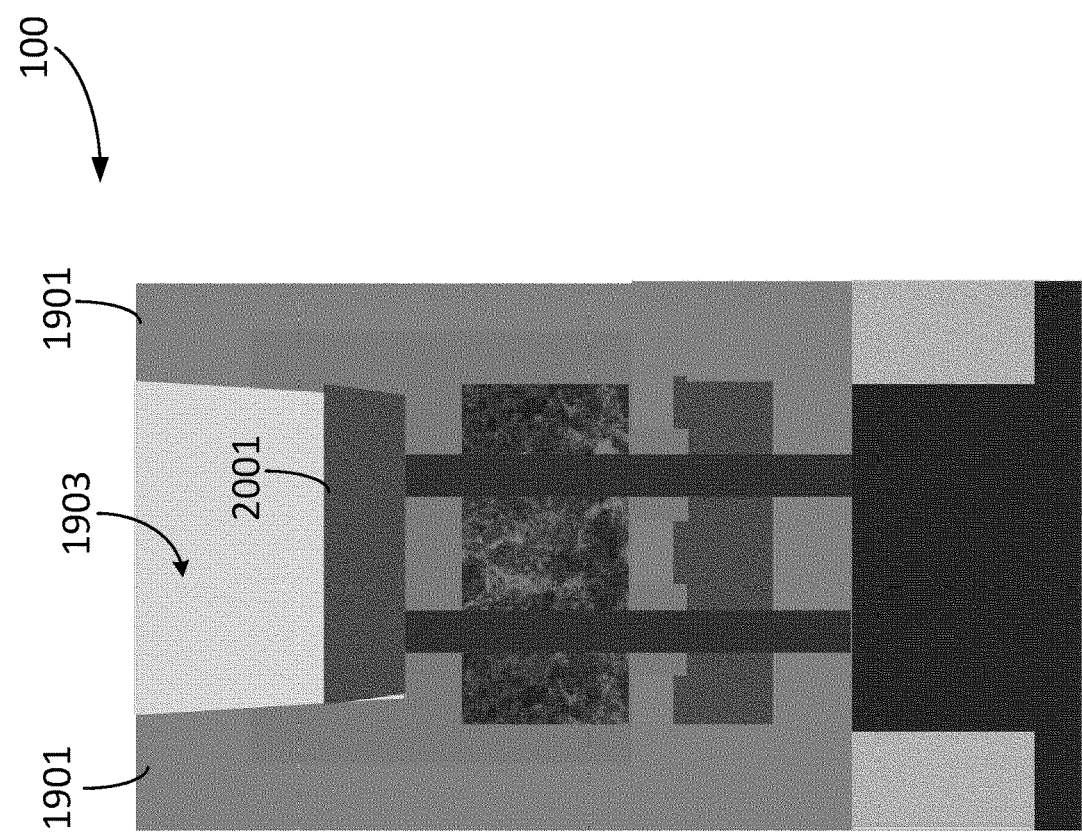
FIGS. 22A-22B are cross-sectional view schematic drawings of the vertical pillar structure (partially completed) illustrated in FIG. 1 after a gate contact formation operation according to some embodiments.
Figure 22B:
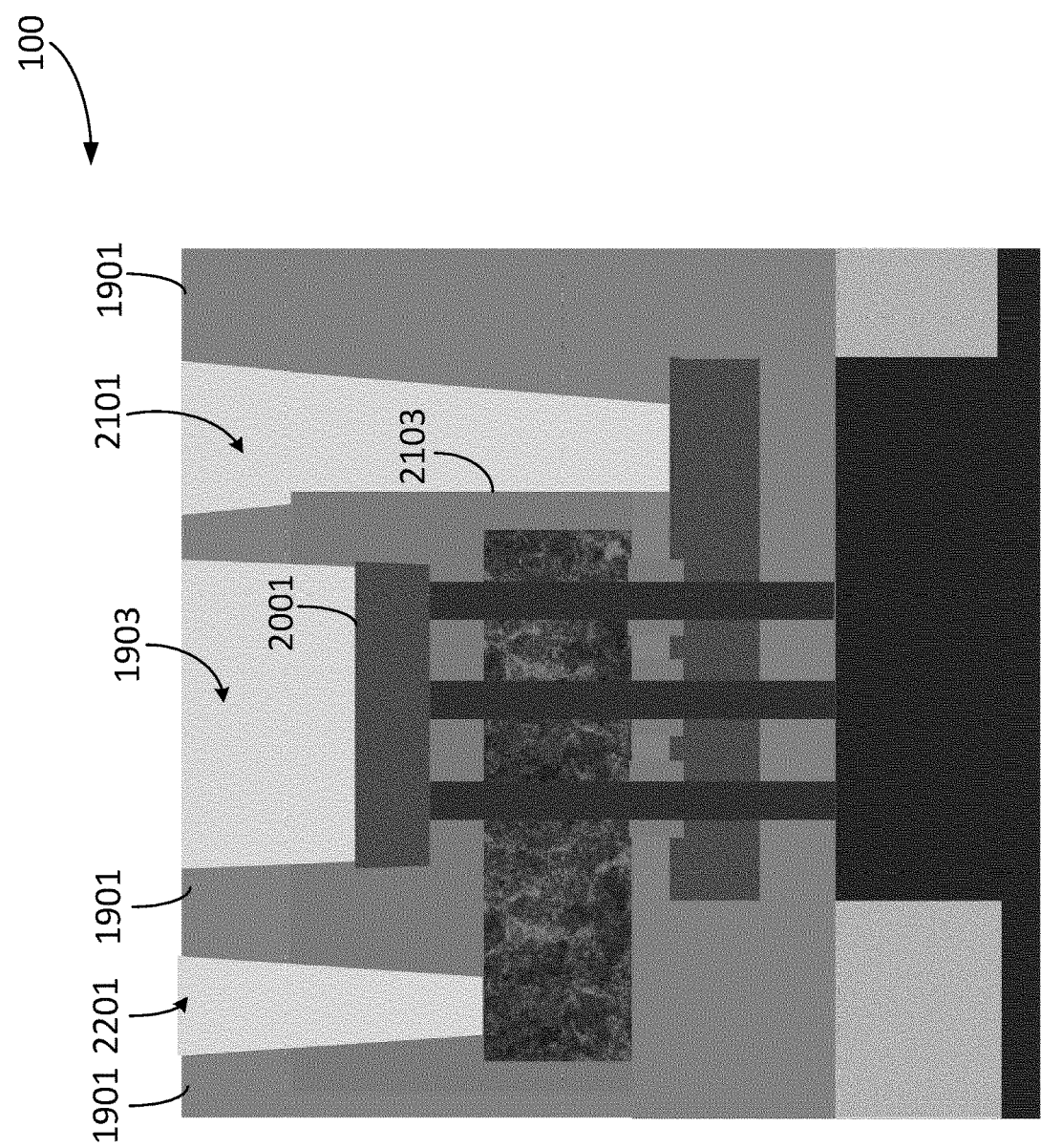

With reference to FIGS. 22A-22B, cross-section views of a partially completed structure of the vertical pillar structure 100 are depicted according to some embodiments. In some embodiments, a gate contact via or aperture 2201 is formed. In some embodiments, the gate contact aperture 2201 is formed by etching from the surface of the spacer layer 1801 at a location above the RMG 1701 to the top surface of the RMG 1701. In some embodiments, the gate contact aperture 2201 is formed by lithographical patterning and selective etching.

Figure 23A:
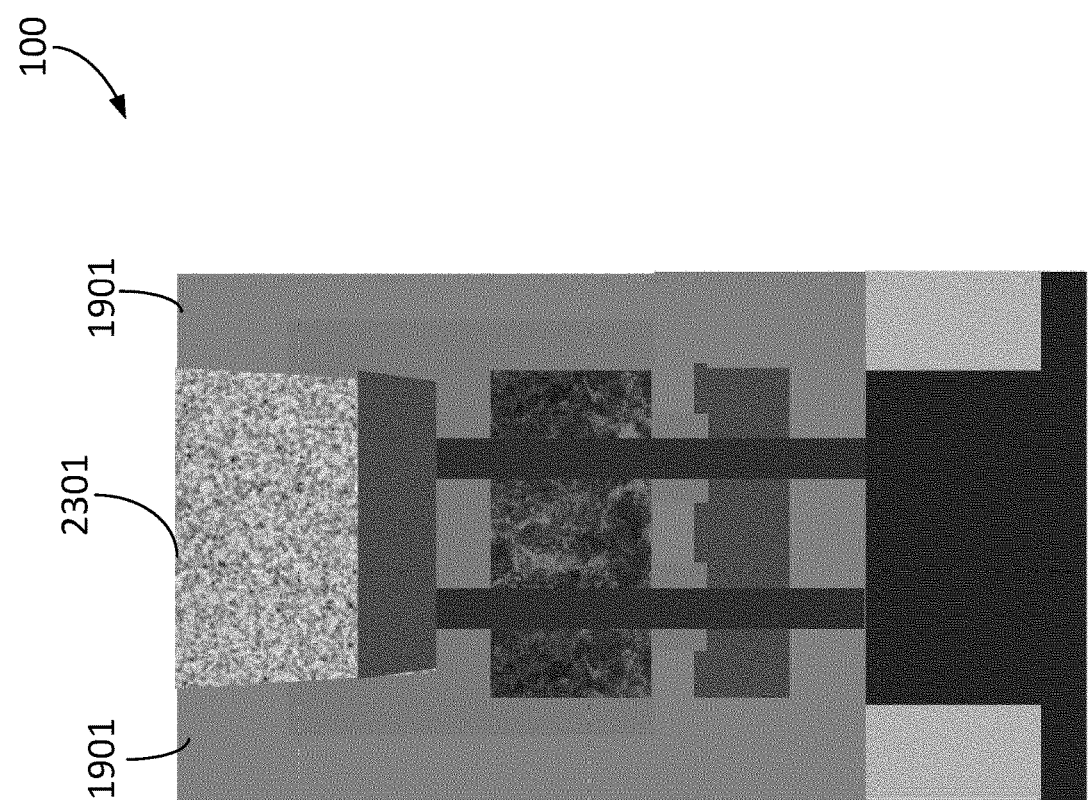
FIGS. 23A-23B are cross-sectional view schematic drawings of the vertical pillar structure (partially completed) illustrated in FIG. 1 after a silicide and metallization operation according to some embodiments.
Figure 23B:
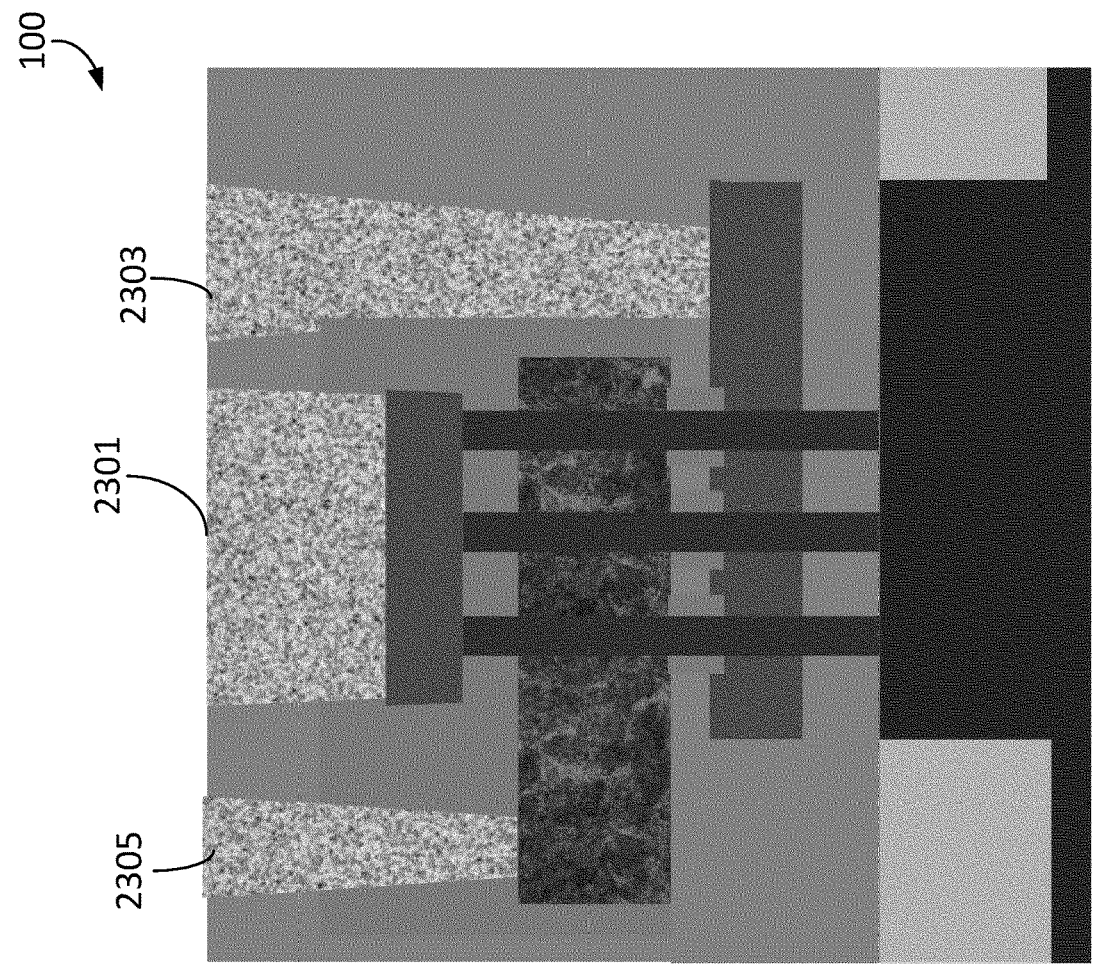

With reference to FIGS. 23A-23B, cross-section views of a partially completed structure of the vertical pillar structure 100 are depicted according to some embodiments. After forming the gate contact aperture 2201 and the drain contact aperture 2101, a silicide is formed at the top surface of the source section 2001 and the top surface of the drain section 1001 according to some embodiments. Metallization is applied on top of the silicide and the gate contact aperture 2201 the drain contact aperture 2101, and the aperture above the source region 2001 to form respective contacts. The metallization is applied using any suitable metallization techniques or via filling techniques according to some embodiments. The vertical pillar structure 100 provides one or more vertical transistors in some embodiments.

Figure 24:
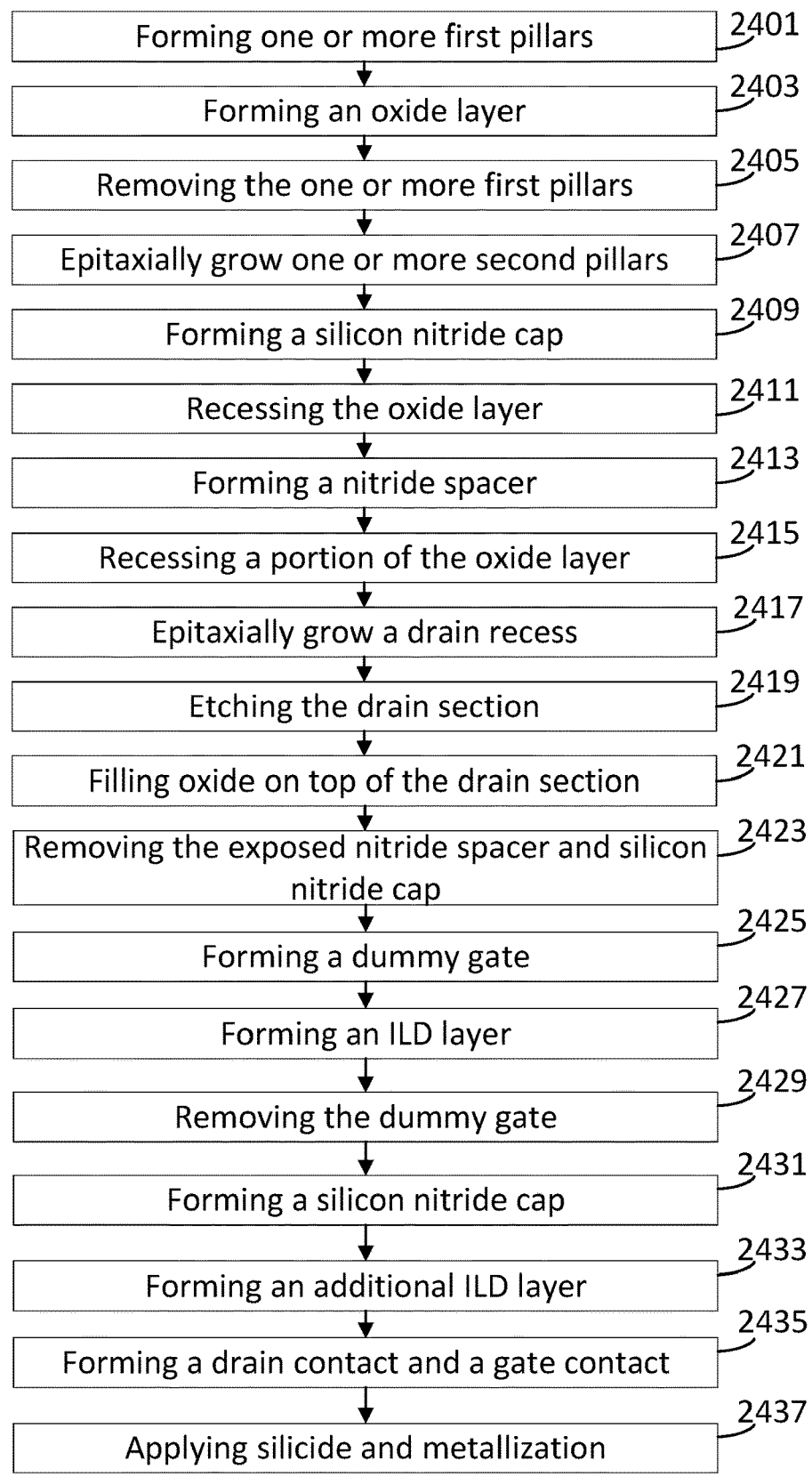
FIG. 24 is a flow diagram showing operations for fabricating a vertical pillar device according to some embodiments.

With respect to FIG. 24, a flow 2400 for fabricating a vertical pillar device is shown according to some embodiments. At an operation 2401, one or more first pillars are formed in a substrate according to some embodiments. The one or more first pillars are formed using the same material (e.g., silicon) as the substrate according to some embodiments. The one or more first pillars are arranged in rows and/or columns according to some embodiments. The one or more first pillars are formed within a region in the substrate surrounded by a STI layer. A number of the first pillars is determined by current and leakage requirement of one or more applications of the vertical pillar device according to some embodiments.

At an operation 2403, an oxide layer is formed on top of the substrate and surrounding the one or more first pillars. A polishing operation (e.g., CMP operation) is applied on a top surface of the oxide layer to expose the top surface of the one or more first pillars according to some embodiments.

At an operation 2405, the one or more first pillars are removed by an etching operation to form one or more pillar recesses according to some embodiments.

At an operation 2407, an epitaxial growth operation is applied to the one or more pillar recesses to form one or more second pillars according to some embodiments. The one or more second pillars are formed with any material or Ge according to some embodiments. In some embodiments, the one or more second pillars include a first set of pillars formed with a first type of material at a first time, and a second set of pillars formed with a second type of material at a second time. In some embodiments, the one or more second pillars can be formed by epitaxial growth using different types of materials.

At an operation 2409, a silicon nitride cap is formed on top of each of the one or more second pillars according to some embodiments. The silicon nitride caps are formed with a desired depth according to some embodiments.

At an operation 2411, the oxide layer is recessed to a level that is below the silicon nitride cap according to some embodiments. The oxide layer is recessed to expose a desired portion of the one or more second pillars according to some embodiments.

At an operation 2413, nitride spacer is formed surrounding the side wall of the one or more second pillars and the side wall of the silicon nitride caps according to some embodiments.

At an operation 2415, a portion of the oxide layer that surrounds the one or more second pillars is recessed to form a drain recess. The drain recess is formed at a level that is above a defective interface between the one or more second pillars and the substrate according to some embodiments. There is a desired distance formed between the drain recess and the interface according to some embodiments. In this way, the drain is formed at a location away from the defective interface according to some embodiments.

At an operation 2417, an epitaxial growth operation is applied to the drain recess to form a drain section according to some embodiments. The epitaxial growth operation is applied with any suitable semiconductor material, such as crystalline SeGe semiconductor material. The drain section is formed to surround each of the one or more second pillars and in contact with the spacer around the pillars according to some embodiments.

At an operation 2419, the drain section is etched back to a level near the bottom of the spacer such that the bottom of the spacer is still in contact with the drain section according to some embodiments.

At an operation 2421, filling oxide on top of the drain section and the oxide layer to make a flat top surface of the oxide layer that covers the whole drain section and at least a portion of the spacer according to some embodiments.

At an operation 2423, removing the exposed nitride spacer and the silicon nitride cap from the one or more second pillars according to some embodiments.

At an operation 2425, a dummy gate is formed to surround the sidewall and the top surface of the one or more second pillars according to some embodiments. The dummy gate is formed by depositing polysilicon and photonic crystal patterning according to some embodiments. A spacer is formed on top of the gummy gate according to some embodiments.

At an operation 2427, an ILD layer is formed on top of the spacer such that the oxide layer and the ILD layer form one layer that is surrounding the spacer according to some embodiments. In some embodiments, the ILD layer is made of oxide, same as the oxide layer. A polishing operation is applied to the top of the spacer to expose the dummy gate according to some embodiments.

At an operation 2429, the dummy gate is removed to form a gate recess according to some embodiments. A gate is formed in the gate recess according to some embodiments. The gate is formed with a height that is lower than the top surface of the one or more second pillars. The gate is formed as a replacement metal gate according to some embodiments.

At an operation 2431, a silicon nitride cap is form on top of the one or more second pillars and the gate according to some embodiments. The silicon nitride cap is formed by filling silicon nitride in the gate recess according to some embodiments.

At an operation 2433, additional ILD layer is formed on a top surface of the silicon nitride cap and the top surface of the oxide layer according to some embodiments. A source recess is formed by an etching operation to expose the top surface of the one or more second pillars according to some embodiments. A source section is formed by applying an epitaxial operation on the source recess according to some embodiments. The source section is formed to be connected to the top surface of the second pillars according to some embodiments.

At an operation 2435, a self-aligned drain contact is formed by etching vertically across the oxide layer from the top surface of the oxide layer to the top surface of the sink section according to some embodiments. A gate contact is formed by etching vertically down from the top surface of the oxide layer to the top surface of the gate according to some embodiments.

At an operation 2437, applying silicide and metallization to fill the openings above the drain contact, the source section and the gate contact with a desired metal material according to some embodiments. In some embodiments, multiple types of material are provided on one substrate for different devices on the substrate. For example, pillars of a first vertical pillar device on one substrate are formed in a first material, and pillars of a second vertical pillar device on the same substrate are formed in a second material according to some embodiments.

The disclosure is described above with reference to drawings. These drawings illustrate certain details of specific embodiments that implement the systems and methods and programs of the present disclosure. However, describing the disclosure with drawings should not be construed as imposing on the disclosure any limitations that are present in the drawings. No claim element herein is to be construed as a "means plus function" element unless the element is expressly recited using the phrase "means for." Furthermore, no element, component or method step in the present disclosure is intended to be dedicated to the public, regardless of whether the element, component or method step is explicitly recited in the claims.

It should be noted that certain passages of this disclosure can reference terms such as "first" and "second" in connection with devices for purposes of identifying or differentiating one from another or from others. These terms are not intended to relate entities or operations (e.g., a first region and a second region) temporally or according to a sequence, although in some cases, these entities can include such a relationship. Nor do these terms limit the number of possible entities or operations. Further, the term source/drain region refers to a source region, a drain region, or a region that can be used as a source or a drain. In some embodiments, the source and drain regions can be interchanged.

It should be understood that the circuits described above can provide multiple ones of any or each of those components. In addition, the structures, circuits and methods described above can be adjusted for various system parameters and design criteria, such as shape, depth, thicknesses, etc. Although shown in the drawings with certain components directly coupled to each other, direct coupling is not shown in a limiting fashion and is exemplarily shown. Alternative embodiments include circuits with indirect coupling between the components shown.

It should be noted that although the flowcharts provided herein show a specific order of method steps, it is understood that the order of these steps can differ from what is depicted. Also two or more steps can be performed concurrently or with partial concurrence. Such variation will depend on the software and hardware systems chosen and on designer choice. It is understood that all such variations are within the scope of the disclosure.

While the foregoing written description of the methods and systems enables one of ordinary skill to make and use what is considered presently to be the best-mode thereof, those of ordinary skill will understand and appreciate the existence of variations, combinations, and equivalents of the specific embodiment, method, and examples herein. The present methods and systems should therefore not be limited by the above described embodiments, methods, and examples, but by all embodiments and methods within the scope and spirit of the disclosure.

What is claimed is:

1. A vertical transistor, comprising:
   a substrate;
   a pillar comprising a first end and a second end, the first end connected to the substrate at a first interface, wherein the substrate and the pillar are made of different materials;
   a drain surrounding the pillar between the first end and the second end, the drain being separated from the first interface; and
   a source connecting to the pillar at the second end.

2. The vertical transistor of claim 1, further comprising a gate formed between the drain and the source and surrounding the pillar.

3. The vertical transistor of claim 1, wherein the drain and the source are connected through the pillar.

4. The vertical transistor of claim 2, further comprising: another pillar connected to the pillar through the gate.

5. The vertical transistor of claim 1, wherein the pillar comprises a III-V material or a high percentage of Germanium.

6. The vertical transistor of claim 1, wherein the first interface is defective.

7. A vertical transistor provided on an integrated circuit, the vertical transistor, comprising:
   a plurality of pillars disposed above a substrate, each of the plurality of pillars comprising a first end and a second end, the first end connected to the substrate at a first interface, wherein the substrate and the pillar are made of different materials; and
   a drain section of between the first ends of the plurality of pillars and the second ends of the plurality of pillars, the drain section being spaced away from the first interface.

8. The vertical transistor of claim 7, wherein the drain section is disposed near a bottom end of the plurality of pillars.

9. The vertical transistor of claim 7, further comprising a source section connected at a top end of the plurality of pillars.

10. The vertical transistor of claim 7, wherein the plurality of pillars are formed with III-V material or Ge material.

11. The vertical transistor of claim 7, wherein the first interface comprises defects.

12. The vertical transistor of claim 9, wherein the drain section and the source section are vertically connected through the plurality of pillars.

13. The vertical transistor of claim 12, further comprising:
   a gate disposed vertically between the source section and the drain section and surrounded the plurality of pillars.

14. The vertical transistor of claim 13, wherein the plurality of pillars are connected through the gate.

15. A vertical transistor, comprising;
   a substrate;
   a pillar connected to the substrate at a first interface;
   a drain surrounding the pillar between a first end of the pillar and a second end of the pillar, wherein the first end of the pillar is connected to the substrate at the first interface comprising defects; and
   a source disposed at the second end of the pillar, wherein the pillar comprises different material compared to a top layer of the substrate.

16. The vertical transistor of claim 15, wherein the drain is separated from the first interface.

17. The vertical transistor of claim 16, wherein the drain is above a top surface of the substrate.

18. The vertical transistor of claim 15, wherein the pillar is grown in an epitaxial process.

19. The vertical transistor of claim 15, further comprising an insulative spacer surrounding the pillar.

20. The vertical transistor of claim 15, wherein the pillar comprises a III-V material or a high percentage of Germanium.

* * * * *